United States Patent
Hong et al.

(10) Patent No.: US 11,646,400 B2
(45) Date of Patent: *May 9, 2023

(54) DISPLAY MODULE HAVING GLASS SUBSTRATE ON WHICH SIDE WIRINGS ARE FORMED AND MANUFACTURING METHOD OF THE SAME

(71) Applicant: SAMSUNG ELECTRONICS CO., LTD., Suwon-si (KR)

(72) Inventors: Soonmin Hong, Suwon-si (KR); Gyuhwa Kim, Suwon-si (KR); Jeonggen Yoon, Suwon-si (KR); Tackmo Lee, Suwon-si (KR); Gyun Heo, Suwon-si (KR); Youngjun Moon, Suwon-si (KR); Kyungwoon Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

This patent is subject to a terminal disclaimer.

(21) Appl. No.: 17/343,182

(22) Filed: Jun. 9, 2021

(65) Prior Publication Data
US 2021/0305477 A1   Sep. 30, 2021

Related U.S. Application Data

(63) Continuation of application No. 16/786,514, filed on Feb. 10, 2020, now Pat. No. 11,056,630.

(30) Foreign Application Priority Data

Feb. 13, 2019   (KR) .................. 10-2019-0016611
Nov. 29, 2019   (KR) .................. 10-2019-0156922

(51) Int. Cl.
*H01L 33/62*   (2010.01)
*H01L 27/12*   (2006.01)
*H01L 25/16*   (2023.01)

(52) U.S. Cl.
CPC ............ *H01L 33/62* (2013.01); *H01L 25/167* (2013.01); *H01L 27/1262* (2013.01); *H01L 2933/0066* (2013.01)

(58) Field of Classification Search
CPC ... H01L 33/62; H01L 27/1262; H01L 25/167; H01L 2933/0066; H01L 27/1214; H01L 25/0753
See application file for complete search history.

(56) References Cited

U.S. PATENT DOCUMENTS 9,276,055 B1 *   3/2016   Son .................. H01L 51/5281
9,356,087 B1 *   5/2016   Lee .................. H01L 22/32
(Continued)

FOREIGN PATENT DOCUMENTS

EP   3 798 719 A1   3/2021
JP   2015-175969 A   10/2015
(Continued)

OTHER PUBLICATIONS

Communication dated Jul. 2, 2021 issued by the Korean Intellectual Property Office in counterpart English Korean Application No. 10-2021-0071117.
(Continued)

*Primary Examiner* — Victor A Mandala
(74) *Attorney, Agent, or Firm* — Sughrue Mion, PLLC

(57) ABSTRACT

A display module includes a glass substrate having a front surface and a back surface opposite to the front surface; a TFT layer; LEDs mounted on the TFT layer; and a plurality of side wirings formed at intervals in an edge area of the glass substrate, and the edge area includes a first area
(Continued)

corresponding to a side surface of the glass substrate, a second area adjacent to the side surface, and a third area adjacent to the side surface, and a first chamfered surface formed by chamfering a corner at which the first area and the second area meet, and a second chamfered surface formed by chamfering a corner at which the first area and the third area meet, and each of the plurality of side wirings is disposed along the second area, the first chamfered surface, the first area, the second chamfered surface, and the third area.

10 Claims, 47 Drawing Sheets

(56) References Cited

U.S. PATENT DOCUMENTS

| | | | |
|---|---|---|---|
| 10,593,743 B2 | 3/2020 | Son et al. | |
| 10,650,730 B2 | 5/2020 | Son et al. | |
| 10,930,197 B2 | 2/2021 | Lee et al. | |
| 11,035,908 B2* | 6/2021 | Lee | G01R 31/70 |
| 11,056,630 B2* | 7/2021 | Hong | H01L 25/167 |
| 11,250,738 B2* | 2/2022 | Ting | H01L 25/0753 |
| 11,282,994 B2* | 3/2022 | Feng | G02F 1/13336 |
| 11,322,489 B2* | 5/2022 | Huang | H01L 25/0753 |
| 11,398,538 B2* | 7/2022 | Son | H01L 27/32 |
| 2008/0030124 A1* | 2/2008 | Ryu | H01J 63/02 313/496 |
| 2008/0191231 A1* | 8/2008 | Park | G02F 1/133603 257/E25.02 |
| 2014/0170387 A1 | 6/2014 | Kashima et al. | |
| 2016/0013159 A1 | 1/2016 | Kwon | |
| 2016/0280590 A1 | 9/2016 | Kashima et al. | |
| 2017/0148374 A1* | 5/2017 | Lee | G09G 5/14 |
| 2018/0188579 A1* | 7/2018 | Jeong | G02F 1/136286 |
| 2018/0190631 A1* | 7/2018 | Kim | H01L 27/3276 |
| 2018/0190747 A1* | 7/2018 | Son | G09G 3/32 |
| 2018/0197935 A1* | 7/2018 | Yuan | H01L 27/3276 |
| 2019/0005870 A1 | 1/2019 | Son et al. | |
| 2019/0035817 A1 | 1/2019 | Park | |
| 2019/0067630 A1* | 2/2019 | Hwang | H01L 51/5246 |
| 2019/0165333 A1* | 5/2019 | Harada | H01L 51/0097 |
| 2020/0161412 A1* | 5/2020 | Lin | H01L 33/62 |
| 2020/0176537 A1 | 6/2020 | Son et al. | |
| 2020/0251457 A1* | 8/2020 | Huang | H01L 25/0753 |

FOREIGN PATENT DOCUMENTS

| | | |
|---|---|---|
| JP | 2016-157980 A | 9/2016 |
| KR | 10-2010-0042699 A | 4/2010 |
| KR | 10-1312170 A | 9/2013 |
| KR | 10-2014-0063611 A | 5/2014 |
| KR | 10-2015-0133068 A | 11/2015 |
| KR | 10-2016-0006032 A | 1/2016 |
| KR | 10-2017-0059523 A | 5/2017 |
| KR | 10-2018-0022358 A | 3/2018 |
| KR | 10-2018-0079078 A | 7/2018 |
| KR | 10-2018-0121522 A | 11/2018 |
| KR | 10-2019-0002178 A | 1/2019 |
| WO | 2008109262 A1 | 9/2008 |
| WO | 2020/130493 A1 | 6/2020 |

OTHER PUBLICATIONS

Communication dated Oct. 20, 2021 issued by the European Intellectual Property Office in counterpart European Application No. 20756313.1.
Communication dated May 16, 2020, issued by the Korean Intellectual Property Office in corresponding Korean Application No. 10-2019-0156922.
Communication dated Feb. 16, 2021, issued by the Korean Intellectual Property Office in Korean Application No. 10-2020-0181297.
International Search Report (PCT/ISA/210), issued by International Searching Authority in corresponding International Application No. PCT/KR2020/002013, dated May 20, 2020.
Written Opinion (PCT/ISA/237) issued by the International Searching Authority in corresponding International Application No. PCT/KR2020/002013, dated May 20, 2020.
Communication dated Sep. 21, 2020 issued by the Korean Intellectual Property Office in application No. 10-2019-0156922.

* cited by examiner

DISPLAY MODULE HAVING GLASS SUBSTRATE ON WHICH SIDE WIRINGS ARE FORMED AND MANUFACTURING METHOD OF THE SAME

CROSS-REFERENCE TO RELATED APPLICATIONS

This application is a Continuation of U.S. application Ser. No. 16/786,514 filed Feb. 10, 2020, which is based on and claims priority under 35 U.S.C. § 119 to Korean Patent Application No. 10-2019-0016611, filed on Feb. 13, 2019, and Korean Patent Application No. 10-2019-0156922, filed on Nov. 29, 2019, in the Korean Intellectual Property Office, the disclosures of which are herein incorporated by reference in their entireties.

BACKGROUND

1. Field

Apparatuses and methods consistent with the disclosure relate to a display module having a glass substrate on which side wirings are formed and a method for forming the side wirings, and more particularly, to a display module having a glass substrate on which side wirings are formed in an edge area of the glass substrate to implement a bezel-less design, and a manufacturing method of the same.

2. Description of the Related Art

A self-light emitting display element that displays an image without a color filter and a backlight may use a light emitting diode (LED) inorganic self-light emitting element that emits light by itself.

A display module expresses various colors as it is operated in a unit of pixels or sub-pixels composed of LED inorganic self-light emitting elements, and an operation of each pixel or sub-pixel is controlled by a thin film transistor (TFT). A plurality of TFTs are arranged on a flexible substrate, a glass substrate, or a plastic substrate, which is called a TFT substrate.

Such a TFT substrate is applied to a large TV up to several tens of inches from a small device such as a flexible device and a wearable device (for example, a wearable watch, etc.) and used as a substrate for driving a display. In order to drive the TFT substrate, the TFT substrate is connected with an external integrated circuit (IC) or a driver IC capable of applying a current to the TFT substrate. In general, the TFT substrate and each circuit are connected through a chip on glass (COG) bonding or a film on glass (FOG) bonding. For such connection, an area having a constant area, that is, a bezel area, needs to be secured at an edge of the TFT substrate.

Recently, research and development of a bezel-less technology that reduces or eliminates the bezel area so as to maximize an area where an image is displayed in the display module, that is, an active area, have been steadily progressed.

SUMMARY

Embodiments of the disclosure overcome the above disadvantages and other disadvantages not described above. Also, the disclosure is not required to overcome the disadvantages described above, and an embodiment of the disclosure may not overcome any of the problems described above.

The disclosure provides a display module having a glass substrate on which side wirings are formed that may implement a bezel-less design by forming the side wirings in an edge area of the glass substrate to minimize a bezel area of the glass substrate in which a circuit is formed on one surface and disposing a bonding area of a driving circuit on a back surface of the glass substrate, and a manufacturing method of the same.

The disclosure also provides a display module having a glass substrate on which side wirings are formed that may prevent damage on a circuit formed on the glass substrate upon processing the side wirings with a laser beam, and a manufacturing method of the same.

According to an embodiment of the disclosure, a display module includes a glass substrate of a quadrangle type having a front surface and a back surface opposite to the front surface; a thin film transistor (TFT) layer formed on the front surface of the glass substrate; a plurality of light emitting diodes (LEDs) mounted on the TFT layer; and a plurality of side wirings formed at intervals in an edge area of the glass substrate, wherein the edge area includes a first area corresponding to a side surface of the glass substrate, a second area adjacent to the side surface of the glass substrate in the front surface of the glass substrate, and a third area adjacent to the side surface of the glass substrate in the back surface of the glass substrate, and a first chamfered surface formed at a corner at which the first area and the second area meet, and a second chamfered surface formed at a corner at which the first area and the third area meet, and each of the plurality of side wirings is disposed along the second area, the first chamfered surface, the first area, the second chamfered surface, and the third area.

A height of the first chamfered surface may be less than 10% of a thickness t of the glass substrate.

A height of the second chamfered surface may be less than 10% of a thickness t of the glass substrate.

The plurality of side wirings may be formed by screen printing with conductive ink.

One end portion of each of the plurality of side wirings may be electrically connected to a first connection pad disposed in the second area, another end portion of each of the plurality of side wirings may be electrically connected to a second connection pad disposed in the third area, and the first connection pad may be connected to a pixel driving circuit of the TFT layer, and the first connection pad may be connected to a driver Integrated Circuit disposed in a rear surface of a glass substrate.

The display module may further include a plurality of connection pads formed in the edge area and electrically connected to the plurality of side wirings, and an insulating layer having grooves and disposed on the plurality of connection pads, the plurality of connection pads formed in the edge area being partially exposed by the grooves of the insulating layer.

According to another embodiment of the disclosure, a display module includes a glass substrate of a quadrangle type having a front surface and a back surface opposite to the front surface; a thin film transistor (TFT) layer formed on the front surface of the glass substrate; a plurality of light emitting diodes (LEDs) mounted on the TFT layer; and a plurality of side wirings disposed along edge areas of at least two sides of the glass substrate, the plurality of side wirings being disposed at substantially equal intervals, wherein the glass substrate includes a chamfered surface through which the plurality of side wirings pass and the chamfered surface is formed at a corner of each of the edge areas of the at least two sides.

The edge areas of the at least two sides may correspond to a pair of opposing sides in the glass substrate, respectively.

The edge areas of the at least two sides correspond to a pair of adjacent sides in the glass substrate, respectively.

The number of the plurality of side wirings may be equal to or less than the number of LEDs mounted on the TFT layer.

According to still another embodiment of the disclosure, a manufacturing method of a display module includes forming a thin film transistor (TFT) layer on a glass substrate; forming a chamfered surface at a corner of at least one edge area of edge areas of the glass substrate; forming a plurality of side wirings electrically connected to a plurality of connection pads disposed in an edge of the TFT layer in the at least one edge area of the glass substrate in which the chamfered surface is formed; and transferring a plurality of light emitting diodes (LEDs) onto the TFT layer.

The chamfered surface may be formed to have a height less than 10% of a thickness of the glass substrate.

An inclination angle of the chamfered surface may be less than 45 degrees with respect to an imaginary plane extending from a side surface of the glass substrate.

The plurality of side wirings may be formed by one of a laser patterning process, a pad printing process, an ink screening process, and a sputtering process.

In the forming of the plurality of side wirings, the plurality of side wirings may be formed at positions corresponding to a pair of opposing sides in the glass substrate, respectively.

In the forming of the plurality of side wirings, the number of the plurality of side wirings may be formed to be equal to or less than the number of LEDs mounted on the TFT layer.

The forming the plurality of side wirings may include forming a metal film on the edge area and a side surface of the glass substrate, irradiating, by a laser beam irradiator, a laser beam on the metal film from an end of the metal film to a middle portion of the chamfered surface, and rotating the glass substrate relative to the laser beam irradiator and irradiating, by the laser beam irradiator, the laser beam on the metal film from the middle portion of the chamfered surface to the side surface.

The forming the plurality of side wirings may include preparing a carrier film having a plurality of conductive ribbons, disposing the carrier film on the edge area, performing a thermal compressing on the edge area, and removing the carrier film with the plurality of conductive ribbons remaining in the edge area.

The forming the plurality of side wirings may include preparing a three-dimensional pad having a plurality of conductive ribbons, disposing the three-dimensional pad on the edge area, pressing the three-dimensional pad at a predetermined pressure and separating the three-dimensional pad from the edge area with the plurality of conductive ribbons remaining in the edge area.

The forming the plurality of side wirings may include applying, by a nozzle, a conductive ink on the glass substrate from a connection pad of the plurality of connection pads to the edge area, rotating the glass substrate relative to the nozzle, and applying, by the nozzle, the conductive ink on the glass substrate from the chamfered surface toward a side surface the glass substrate.

BRIEF DESCRIPTION OF DRAWINGS

The above and/or other aspects of the disclosure will be more apparent by describing certain embodiments of the present disclosure with reference to the accompanying drawings, in which.

DETAILED DESCRIPTION

Figure 1:
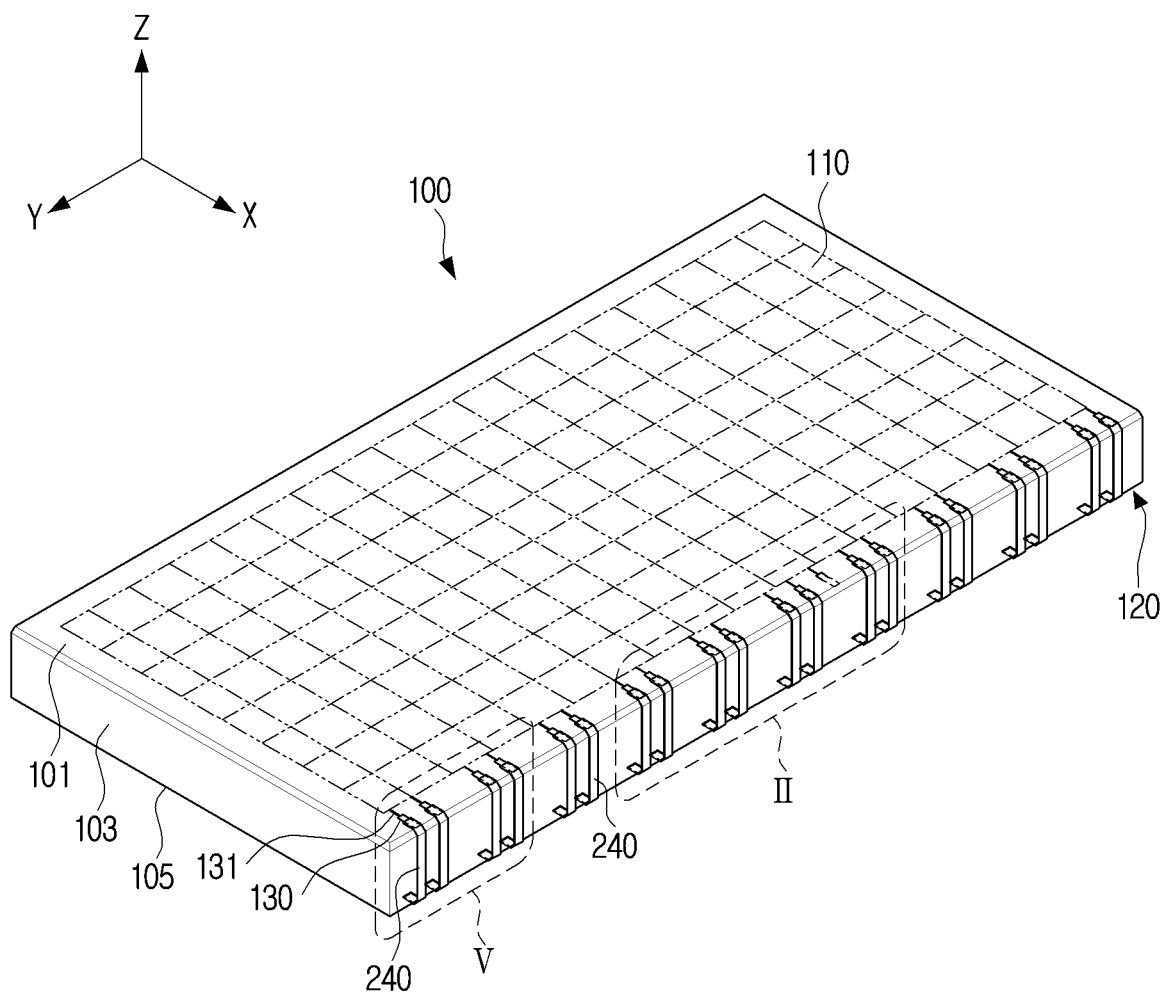
FIG. 1 is a perspective view illustrating a glass substrate having side wirings according to an embodiment of the disclosure.

Hereinafter, diverse embodiments will be described in more detail with reference to the accompanying drawings.

The embodiments described in the specification may be variously modified. A specific embodiment may be illustrated in the drawings and be described in detail in a detailed description. However, the specific embodiment illustrated in the accompanying drawings is provided only to allow the diverse embodiments to be easily understood. Therefore, it should be understood that the spirit of the disclosure is not limited by the specific embodiment illustrated in the accompanying drawings, but includes all the equivalents or substitutions included in the spirit and the scope of the disclosure.

Terms including ordinal numbers such as 'first', 'second', and the like, may be used to describe various components, but such components are not limited by the above-mentioned terms. The terms described above are used only for the purpose of distinguishing one component from another component.

It should be further understood that terms "include" or "have" used in the specification specify the presence of features, numerals, steps, operations, components, parts mentioned in the specification, or combinations thereof, but do not preclude the presence or addition of one or more other features, numerals, steps, operations, components, parts, or combinations thereof. It is to be understood that when one element is referred to as being "connected to" or "coupled to" another element, it may be connected directly to or coupled directly to another element or be connected to or coupled to another element while having the other element interposed therebetween. On the other hand, when it is mentioned that any component is "directly coupled" or "directly connected" to another component, it is to be understood that any component may be coupled or connected to another element without the other component interposed therebetween.

Meanwhile, a term "module" or "~er/~or" for components used in the specification performs at least one function or operation. In addition, a "module" or a "~er/~or" may perform a function or an operation by hardware, software, or a combination of hardware and software. In addition, a plurality of "modules" or a plurality of "~ers/~ors" except for a "module" or a "~er/~or" performed by specific hardware or performed by at least one processor may be integrated in at least one module. Singular expressions include plural expressions unless the context clearly indicates otherwise.

Further, when it is decided that a detailed description for the known function or configuration related to the disclosure may unnecessarily obscure the gist of the disclosure, the detailed description thereof will be abbreviated or omitted.

In the disclosure, side wirings may be formed on an edge area of a glass substrate to electrically connect a plurality of self-light emitting elements arranged on a front surface of the glass substrate and circuits located on a back surface of the glass substrate. A thin film transistor (TFT) layer on which a TFT circuit is formed may be disposed on the front surface of the glass substrate, and the circuit may not be disposed on the back surface of the glass substrate.

In the disclosure, the display module may have a black matrix formed between the plurality of LEDs arranged on the TFT layer. The black matrix may improve a contrast ratio by blocking light leakage from the periphery of the LEDs adjacent to each other.

In the disclosure, the display module may have a molding part formed to cover the plurality of LEDs and the black matrix together. The molding part may be formed of a transparent resin. In this case, the display module may have a touch screen disposed to be stacked on the molding part.

In the disclosure, one surface of the glass substrate on which the TFT layer is disposed may be divided into an active area and an inactive area. The active area may correspond to an area occupied by the TFT layer on one surface of the glass substrate, and the inactive area may correspond to an area included in the edge area on one surface of the glass substrate.

In the disclosure, the edge area of the glass substrate may be the outermost portion of the glass substrate. In addition, the edge area of the glass substrate may be an area other than the area of the glass substrate on which the circuit is formed. In addition, the edge area of the glass substrate may include side surfaces of the glass substrate, and a portion of the front surface of the glass substrate and a portion of the back surface of the glass substrate which are adjacent to the side surfaces.

In the disclosure, corners in the edge area included in the inactive area of the glass substrate may be chamfered to form chamfered surfaces having a predetermined angle. The chamfered surfaces may be formed at a corner between the front surface and the side surface of the glass substrate and at a corner between the back surface and the side surface of the glass substrate. In addition, it is also possible that the chamfered surface is formed only at the corner between the front surface and the side surface of the glass substrate. Such a chamfered surface may prevent the TFT circuit formed on the front surface of the glass substrate from being damaged by a laser beam when processing side wirings with the laser beam.

In the disclosure, it will be described that a plurality of side wirings are formed only in one edge area of four edge areas of the glass substrate, but the disclosure is not limited thereto and the plurality of side wirings may be formed in two or more edge areas as necessary. In this case, the chamfered surface formed in the edge area may be formed at least in all four edge areas of the glass substrate, and may also be formed in only the edge area in which the side wirings are formed.

In the disclosure, the glass substrate may be provided with a plurality of pixels. Each pixel may include a plurality of sub-pixels and a plurality of circuits for driving each pixel. Here, the sub-pixels may be a red LED, a green LED, and a blue LED. In the disclosure, the LED and the sub-pixel have the same meaning and may use the same reference numeral. The LED may be made of an inorganic light emitting material, and may be a semiconductor chip that may emit light by itself when power is supplied thereto. In addition, the LED may have a flip chip structure in which an anode electrode and a cathode electrode are formed on the same surface, and a light emitting surface is formed opposite the electrodes.

In the disclosure, it is possible to provide a display module including a glass substrate having a chamfered surface formed in an edge area, a plurality of pixels disposed on one surface of the glass substrate, and a plurality of side wirings formed at intervals in the edge area. In this case, one end portion of the plurality of side wirings may be electrically connected to a plurality of connection pads formed at the edge area existing on one surface of the glass substrate, respectively, and the other end portions of the plurality of side wirings may be electrically connected to the plurality of connection pads or driving elements formed at the edge area existing on the other surface of the glass substrate, respectively.

In order to minimize a bezel area of a display module, the plurality of connection pads may be formed in the edge area of the glass substrate, and a driver IC (Integrated Circuit)

may be disposed in the other surface (or rear surface) of the glass substrate. Here, the driver IC may include a gate driver IC and a data driver IC.

One end of the plurality of side wirings is formed in a front surface of the glass substrate and electrically connected to a plurality of connection pads which are connected to a pixel driving circuit of the TFT layer for driving a LED, and another end is electrically connected to a plurality of second connection pads which are connected to the driver IC disposed in a rear surface of the glass substrate.

The plurality of first connection pads may be formed on the TFT layer together with a pixel driving circuit and wirings. In this case, the TFT layer may be provided in the form of a film and attached to a front surface of the glass substrate. The plurality of first connection pads may be located in an edge area (inactive area) of the front surface of the glass substrate. The active area may be an area occupied by the pixel driving circuit of the TFT layer in which a plurality of LEDs operate in the front surface of the glass substrate.

The plurality of second connection pads may be electrically connected to the driver IC through a plurality of wirings formed in the rear surface of the glass substrate. The plurality of second connection pads may be located in an edge area of the rear surface of the glass substrate.

In the disclosure, the glass substrate may be formed in a quadrangle type. Specifically, the glass substrate may be formed in a rectangle type or a square type.

As such, in the disclosure, the glass substrate on which the LEDs are mounted and the side wirings are formed may be referred to as a display module. Such a display module may be installed and applied to a wearable device, a portable device, a handheld device, and an electronic product or an electronic device requiring various displays in a single unit, and may be applied to a display device such as a monitor for a personal computer (PC), a high resolution TV and signage (or a digital signage), an electronic display, and the like through a plurality of assembly arrangements in a matrix type.

Hereinafter, a glass substrate on which side wirings are formed according to an embodiment of the disclosure will be described in detail with reference to the accompanying drawings.

FIG. 1 is a perspective view illustrating a glass substrate having side wirings according to an embodiment of the disclosure.

Referring to FIG. 1, a glass substrate 100 having side wirings according to an example embodiment of the disclosure may include a circuit area 110 provided on a surface of the glass substrate 100 in which a TFT circuit is formed and a plurality of light emitting elements are mounted.

In the disclosure, the TFT circuit formed on the glass substrate 100 may be integrally formed on the surface of the glass substrate or may be manufactured separately from the glass substrate and then attached to the glass substrate.

For example, the TFT circuit may be integrally formed with the glass substrate by forming a thin film transistor (TFT) layer on a surface of the glass substrate through one or more photo patterning processes (deposition, photoresist (PR) coating, exposure, development, etching, and PR removal) on the surface of the glass substrate, or may be formed separately from the glass substrate by coating in the form of a film in which the TFT circuit is formed on the surface of the glass substrate.

Figure 2:
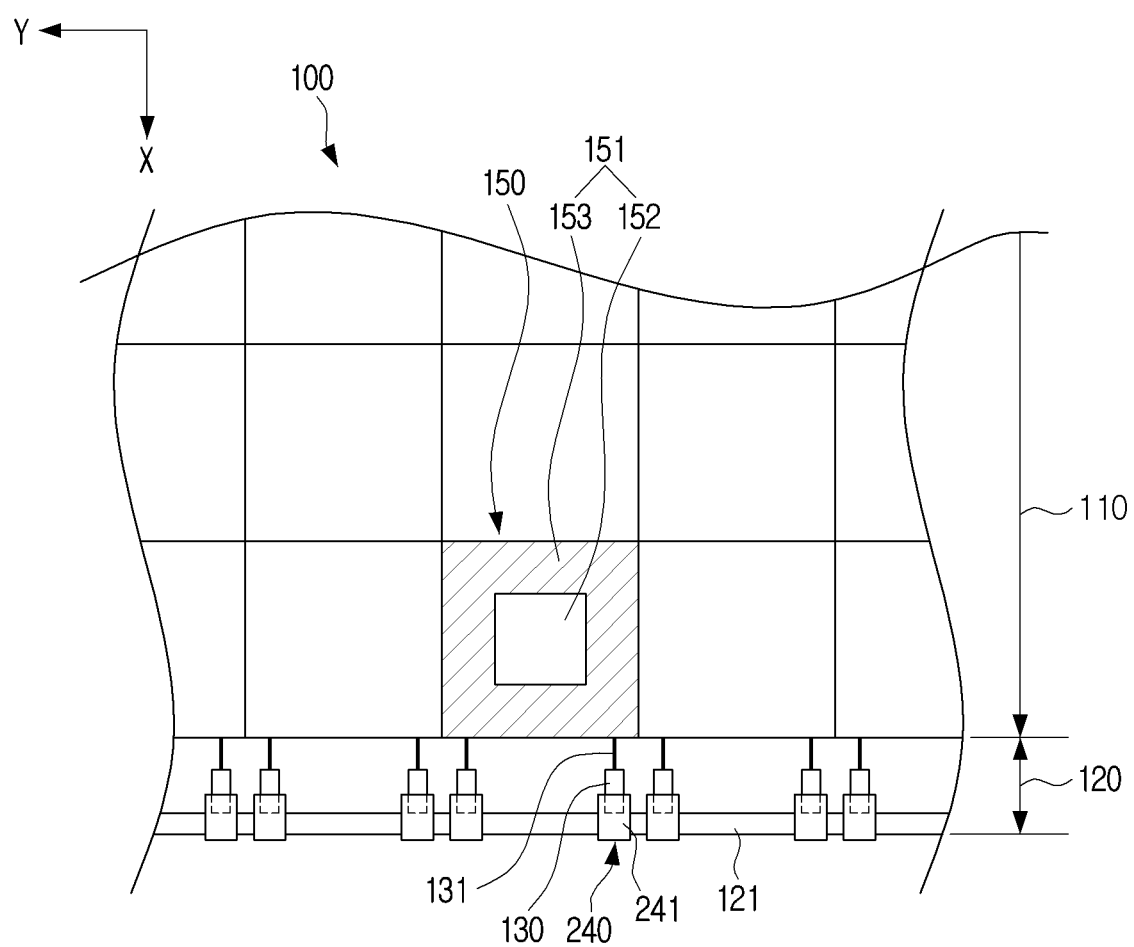
FIG. 2 is an enlarged plan view illustrating a part II indicated in FIG. 1.

The glass substrate 100 may have a plurality of connection pads 130 formed at predetermined intervals along an edge area 120 of the glass substrate 100. The plurality of connection pads 130 may be electrically connected to a plurality of pixels 150 disposed on the circuit area 110 through wirings 131 formed on the surface of the glass substrate 100 as illustrated in FIG. 2.

The glass substrate 100 may have a plurality of side wirings 240 formed in the edge area 120. A width of each of the plurality of side wirings 240 may be several tens of micrometers (μm), and an interval between the side wirings 240 adjacent to each other may be several tens of micrometers. The width of each side wiring 240 may be equal to or larger than the interval between the side wirings adjacent to each other.

Here, the edge area 120 of the glass substrate 100 may include a first area corresponding to a side surface 103 of the glass substrate 100, a second area adjacent to the side surface 103 in a surface 101 of the glass substrate 100, and a third area adjacent to the side surface 103 in the other surface 105 of the glass substrate 100. The surface 101 and the other surface 105 of the glass substrate 100 face in opposite directions.

Hereinafter, for convenience, the surface 101 of the glass substrate 100 is referred to as a front surface 101 of the glass substrate 100, and the other surface 105 of the glass substrate 100 is referred to as a back surface 105 of the glass substrate 100.

FIG. 2 is an enlarged plan view illustrating a part II indicated in FIG. 1.

Referring to FIG. 2, the circuit area 110 may be partitioned into a plurality of pixel areas 151 in which a plurality of pixels 150 are arranged.

The plurality of pixel areas 151 may be partitioned into various forms, and for example, may be arranged in a matrix form. Each pixel area 151 may include a sub-pixel area 152 in which a plurality of pixels, that is, a red LED, a green LED, and a blue LED are mounted, and a driving circuit area 153 for driving each sub-pixel.

Figure 3:
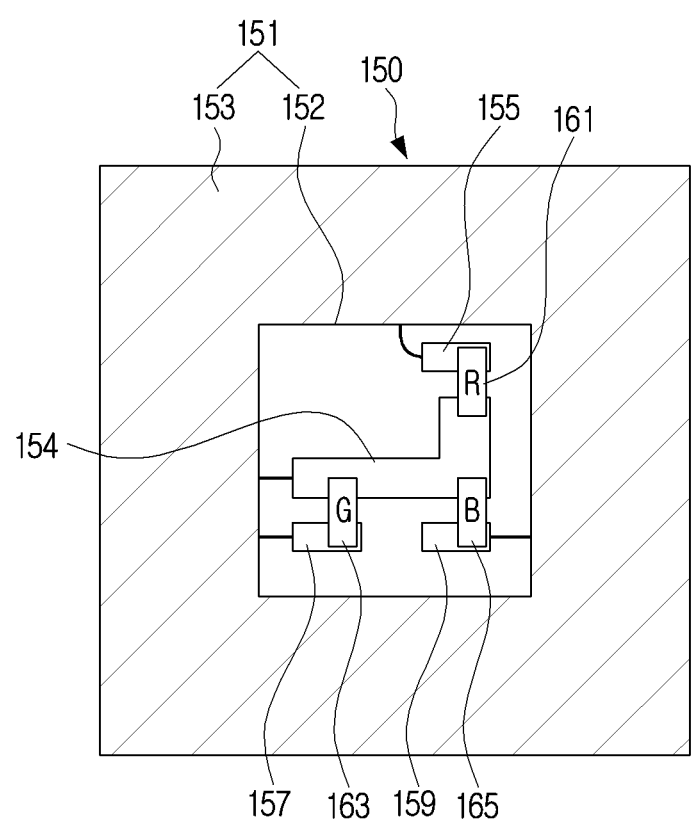
FIGS. 3 and 4 are views each illustrating a unit pixel of the glass substrate and illustrating example in which arrangements of sub-pixels are different from each other.
Figure 4:
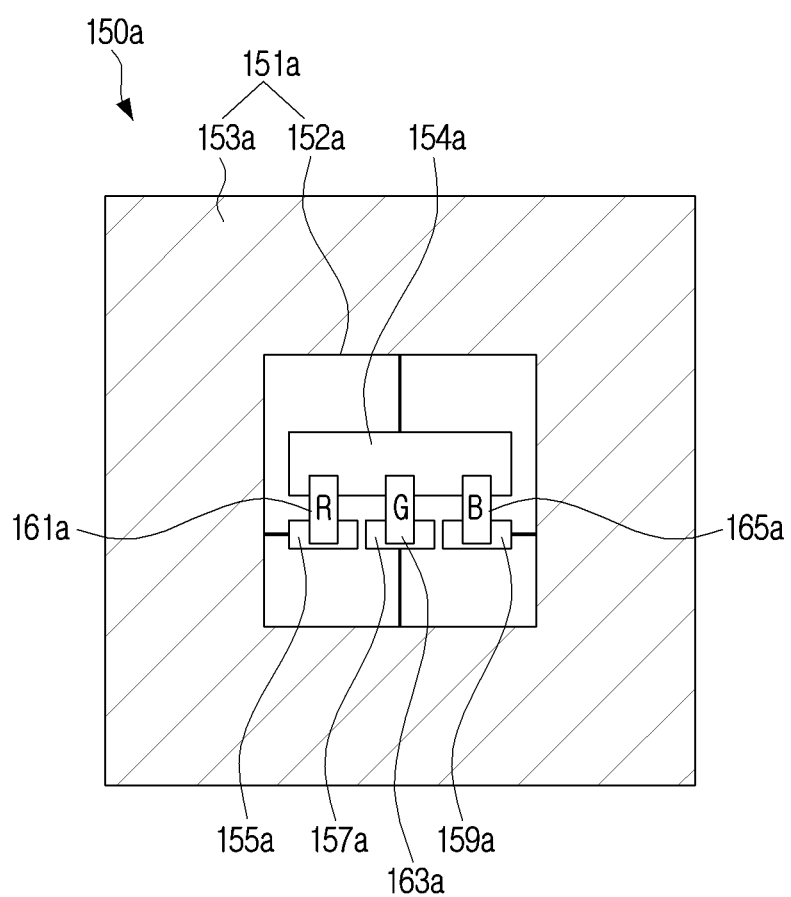

FIGS. 3 and 4 are views each illustrating a unit pixel of the glass substrate 100 and illustrating example in which arrangements of sub-pixels are different from each other.

Referring to FIG. 3, each pixel 150 may include a plurality of sub-pixels 161, 163, and 165 and a driving circuit (not illustrated) for driving each of the plurality of sub-pixels.

The plurality of sub-pixels may include a red LED 161, a green LED 163, and a blue LED 165. The red LED 161, the green LED 163, and the blue LED 165 may be connected to the corresponding electrode pads 155, 157, and 159, respectively, and may be simultaneously connected to a common electrode pad 154, respectively.

The plurality of electrode pads 155, 157, and 159 may be disposed in the driving circuit area 153 and may be electrically connected to a plurality of driving circuits (not illustrated) for driving the plurality of sub-pixels, respectively. The common electrode pad 154 may also be electrically connected to various elements or grounds of the driving circuit area 153.

Three LEDs 161, 163, and 165 may have a substantially L-shaped arrangement as illustrated in FIG. 3. However, the arrangement of the LEDs is not limited thereto, and as illustrated in FIG. 4, three LEDs 161a, 163a, and 165a may be arranged side by side at intervals.

In FIG. 4, a common electrode 154a may be formed in a straight line in consideration of the arrangement of the three LEDs 161a, 163a, and 165a arranged side by side. In FIG. 4, reference numeral 150a represents a pixel, 151a represents a pixel area, 152a represents a sub-pixel area, 153a represents a driving circuit area, and 155a, 157a, and 159a represent electrode pads.

Referring back to FIG. 2, the glass substrate 100 may have the plurality of connection pads 130 formed at intervals in the edge area 120. Each of the plurality of connection pads 130 may be electrically connected to each pixel 150 through the wiring 131. Here, a part of the wiring 131 may correspond to a gate line and the other part of the wiring 131 may correspond to a data line.

In this case, the number of connection pads 130 formed in the edge area 120 may vary according to the number of pixels implemented in the glass substrate, and may vary according to a driving method of the TFT circuit disposed in the circuit area 110. For example, in an active matrix (AM) driving method in which each pixel is individually driven, compared to the case in which the TFT circuit disposed in the circuit area 110 is driven by a passive matrix (PM) driving method in which a plurality of pixels are driven by horizontal lines and vertical lines, more wirings 131 and connection pads 130 may be required.

Figure 5:
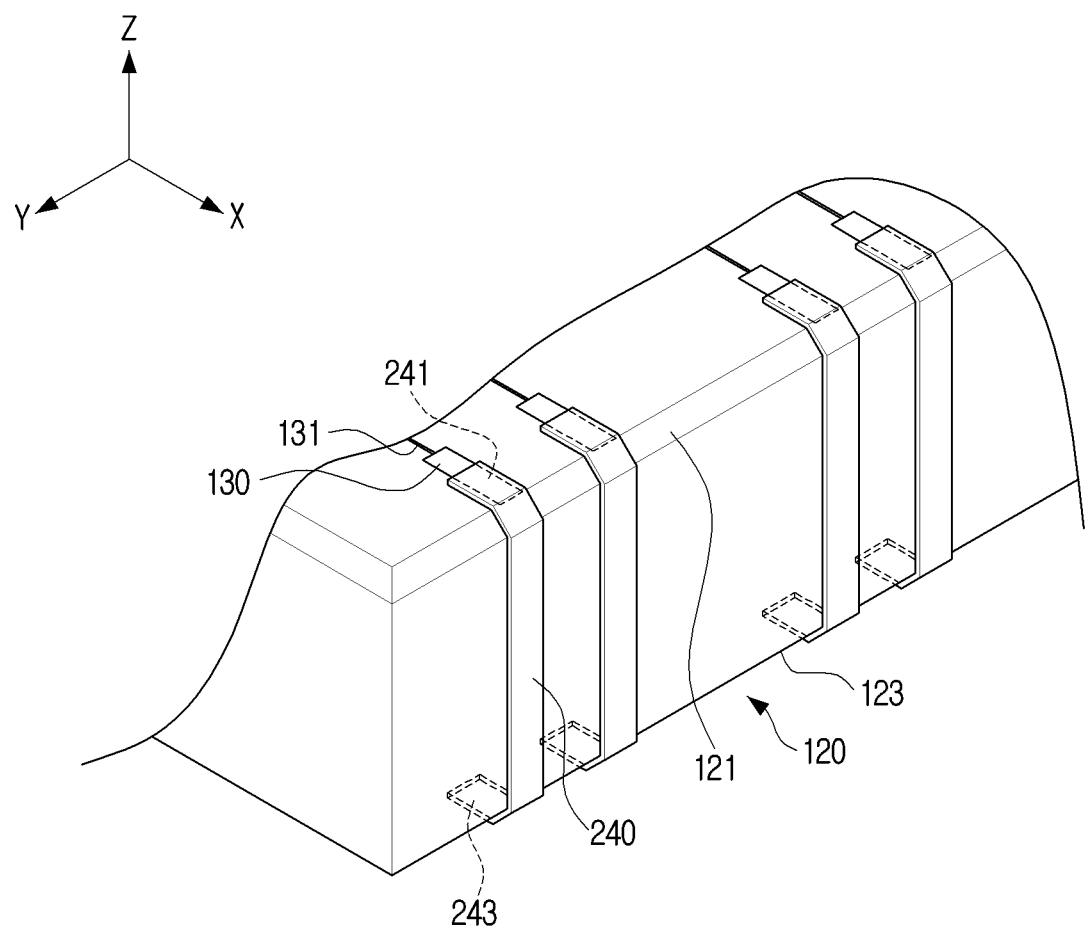
FIG. 5 is an enlarged perspective view illustrating a part V indicated in FIG. 1.

FIG. 5 is an enlarged perspective view illustrating a part V indicated in FIG. 1.

Referring to FIG. 5, the plurality of side wirings 240 are formed at regular intervals in the edge area 120. Each side wiring 240 may have one end portion 241 electrically connected to the connection pad 130 disposed in the second area of the edge area, and the other end portion 243 formed to the third area of the edge area.

A first chamfered surface 121 and a second chamfered surface 123 may be formed in the edge area 120 of the glass substrate 100, respectively. Specifically, the first chamfered surface 121 may be formed by chamfering a corner where the front surface 101 and the side surface 103 of the glass substrate 100 are adjacent to each other. The second chamfered surface 123 may be formed by chamfering a corner where the back surface 105 and the side surface 103 of the glass substrate 100 are adjacent to each other. Accordingly, the first chamfered surface 121 is positioned between the first and second areas of the edge area, and the second chamfered surface 123 is positioned in the first and third areas of the edge area.

The first chamfered surface 121 may prevent the TFT circuit formed on the front surface 101 of the glass substrate 100 from being damaged by a laser beam when processing the side wirings 240 by irradiating the laser beam. The process of processing the side wirings 240 using the laser beam will be described later.

Figure 6:
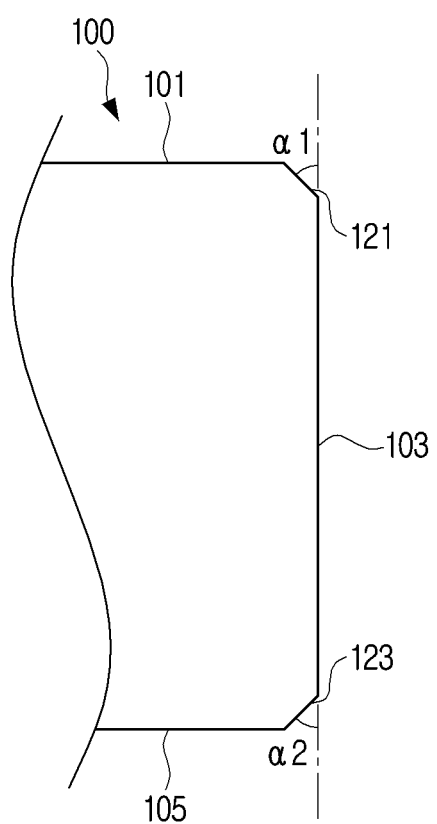
FIG. 6 is a view illustrating angles of chamfered surfaces formed in edge areas corresponding to a front surface and a back surface of the glass substrate, respectively.

FIG. 6 is a view illustrating angles of chamfered surfaces formed in edge areas corresponding to a front surface and a back surface of the glass substrate, respectively.

Referring to FIG. 6, the first chamfered surface 121 may be formed at a first angle $\alpha1$ with respect to the front surface 101 of the glass substrate 100, and the second chamfered surface 123 may be formed at a second angle $\alpha2$ with respect to the back surface 105 of the glass substrate 100.

The first angle $\alpha1$ may be an acute angle, for example, an angle of about 45 degrees, for example, 45 degrees±10 degrees. The second angle $\alpha2$ may also be an acute angle like the first angle $\alpha1$, for example, an angle of about 45 degrees, for example, 45 degrees±25 degrees.

For example, the first and second chamfered surfaces 121 and 123 may form the first angle $\alpha1$ and the second angle $\alpha2$ at the same angle so as to be symmetrical with each other in consideration of processing efficiency. That is, both the first and second angles $\alpha1$ and $\alpha2$ may be set to 45 degrees, or both may be set to the acute angle, but may be set to the same angle.

However, the first and second angles $\alpha1$ and $\alpha2$ do not necessarily have to be formed at the same angle, and the first and second angles $\alpha1$ and $\alpha2$ may be formed differently according to the conditions or environment in which the glass substrate 100 is installed.

As the first and second chamfered surfaces 121 and 123 are formed in the edge area 120 of the glass substrate 100, handleability of the glass substrate 100 may be improved as follows.

In a case in which there is no chamfered surface in the edge area 120 of the glass substrate 100, if the corner of the glass substrate contacts a glass substrate fixing jig (not illustrated) when the glass substrate is aligned or fixed, breakage such as chipping is likely to occur at a sharp rectangular corner of the glass substrate. However, when the first and second chamfered surfaces 121 and 123 are formed in the edge area 120 as in an embodiment of the disclosure, the sharp rectangular structure is removed from the edge area 120, which may result in significantly reducing possibility of breakage even if the edge area 120 contacts the jig.

In addition, in a case in which the glass substrate 100 is dropped, if there is no chamfered surface, the chipping may occur at the rectangular corner of the edge area as the glass substrate is deformed at the moment when the glass substrate collides with a bottom surface, but if there is the chamfered surface in the edge area 120, the frequency of chipping may be significantly reduced.

In addition, the glass substrate made of glass and the side wiring made of metal differ from each other in thermal strain. Accordingly, in the case in which there is no chamfered surface, due to a difference in the thermal strain between the glass substrate and the side wiring, when a part of the side wiring existing on the front surface 101 of the glass substrate and a part of the side wiring existing on the side surface of the glass substrate are expanded, the side wiring is lifted up, which may result in reducing adhesion between the glass substrate and the side wiring, and as a result, there is a problem that a crack occurs in the side wiring in the long term.

However, in the case in which there is the chamfered surface in the edge area as in an embodiment of the disclosure, a stress concentration generated by the chamfered surface is low, and the reduction in the adhesion of the side wiring closely contacted to the glass substrate and the crack generated in the side wiring may be significantly reduced.

Meanwhile, although not illustrated in the drawing, a lower end portion 243 of each side wiring may be electrically connected to another connection pad (not illustrated) or another driving element (not illustrated) formed in the third area of the edge area.

Figure 7:
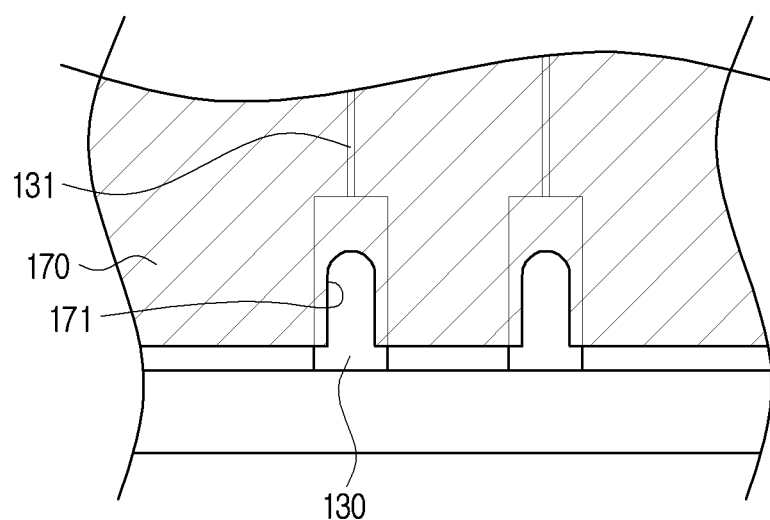
FIG. 7 is a plan view illustrating an example in which an insulating layer is formed on one surface of the glass substrate.

FIG. 7 is a plan view illustrating an example in which an insulating layer is formed on a surface of the glass substrate, and the side wirings are omitted.

Referring to FIG. 7, the remaining portion except for a portion of the edge area 120 of the front surface 101 of the glass substrate 100 may be covered with an insulating layer 170. In addition, the plurality of connection pads 130 formed in the edge area 120 may be partially exposed by exposed grooves 171 of the insulating layer 170 so as to be connected to the side wirings 240, respectively.

Figure 8:
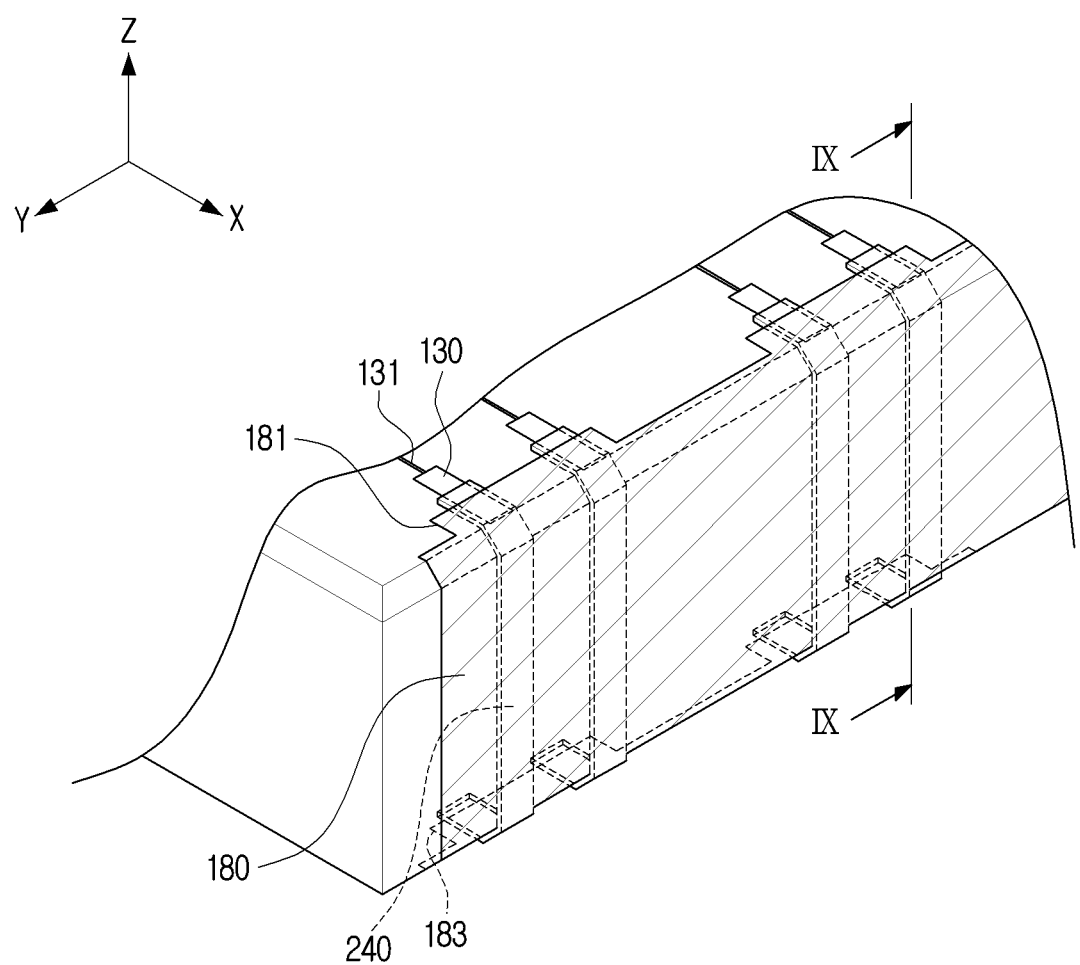
FIG. 8 is a perspective view illustrating an example in which a protective film covering the side wirings is formed in the edge area of the glass substrate.
Figure 9:
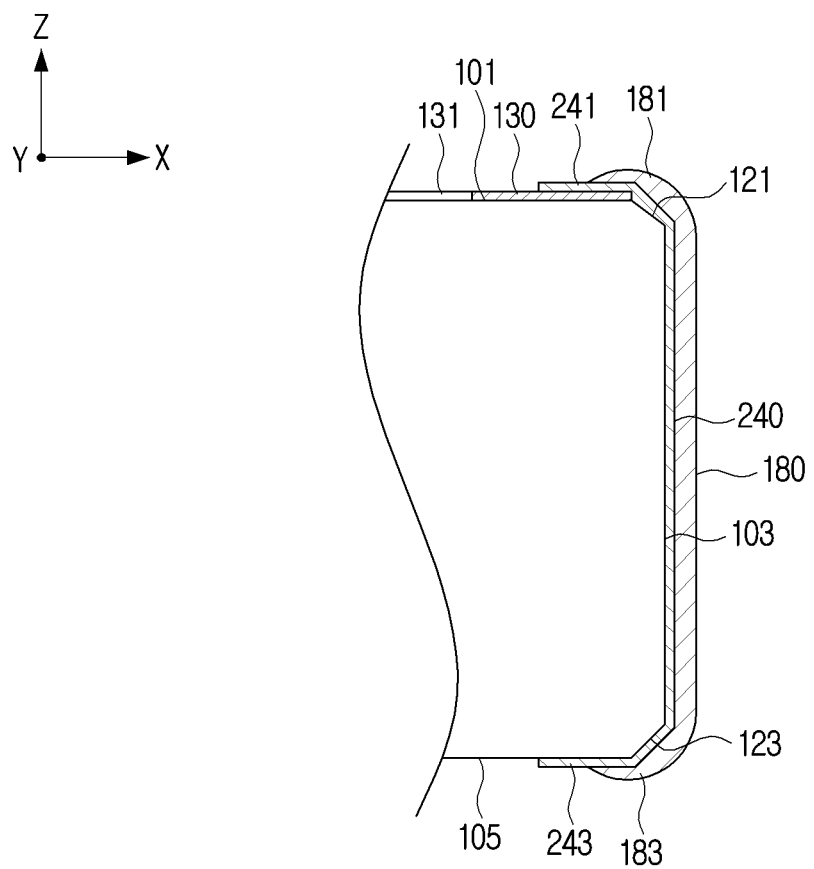
FIG. 9 is a cross-sectional view taken along a line IX-IX indicated in FIG. 8.

FIG. 8 is a perspective view illustrating an example in which a protective film covering the side wirings is formed in the edge area of the glass substrate and FIG. 9 is a cross-sectional view taken along a line IX-IX indicated in FIG. 8.

The plurality of side wirings 240 may have a width of several tens of micrometers (μm) and a thickness of several micrometers, and may be formed with a very fine thickness. Therefore, the plurality of side wirings 240 may be easily damaged by an external structure during various processes such as movement or assembly of the glass substrate 100.

Referring to FIGS. 8 and 9, a protective film 180 made of an insulating material may be formed in the edge area 120 to protect the plurality of side wirings 240.

The protective film 180 may be formed to completely cover the side wirings 240. In this case, because the protective film 180 covers the side wirings 240 and does not need to cover an area where the side wirings 240 are not formed, an upper end 181 and a lower end 183 of the protective film 180 may be formed in an uneven shape, respectively, as illustrated in FIG. 8.

In addition, the protective film 180 may also be formed so as not to completely cover each side wiring 240 and to cover portions of the side wirings 240 formed on the first chamfered surface 121, the side surface 103 of the glass substrate, and the second chamfered surface 123 except for the upper end portion 241 and the lower end portion 243 of each side wiring 240.

In addition, the protective film 180 may also be formed to cover only a portion formed on the side surface 103 of the glass substrate among the entire portions of each side wiring 240.

Hereinafter, after a process of manufacturing a display module according to the disclosure is briefly described, processes of manufacturing side wirings formed on the side surface of the glass substrate according to diverse embodiments will be described in detail.

Figure 10A:
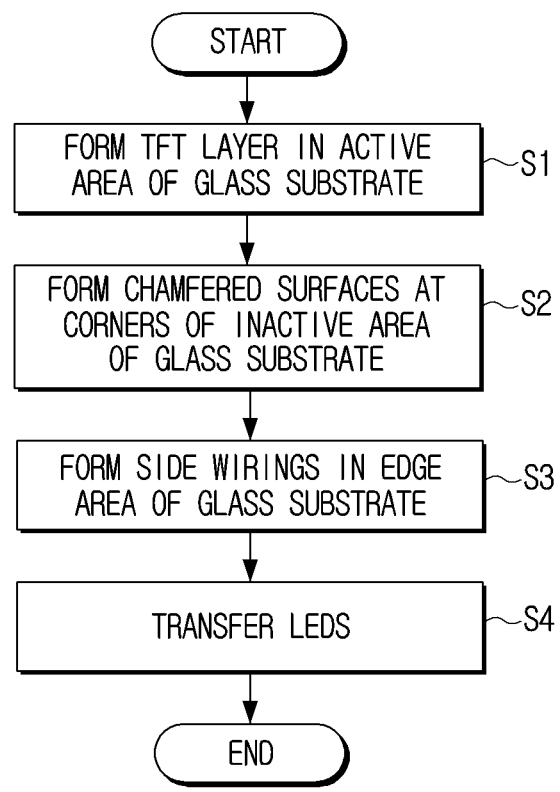
FIG. 10A is a flowchart illustrating a main process of manufacturing a display module according to the disclosure.
Figure 10B:
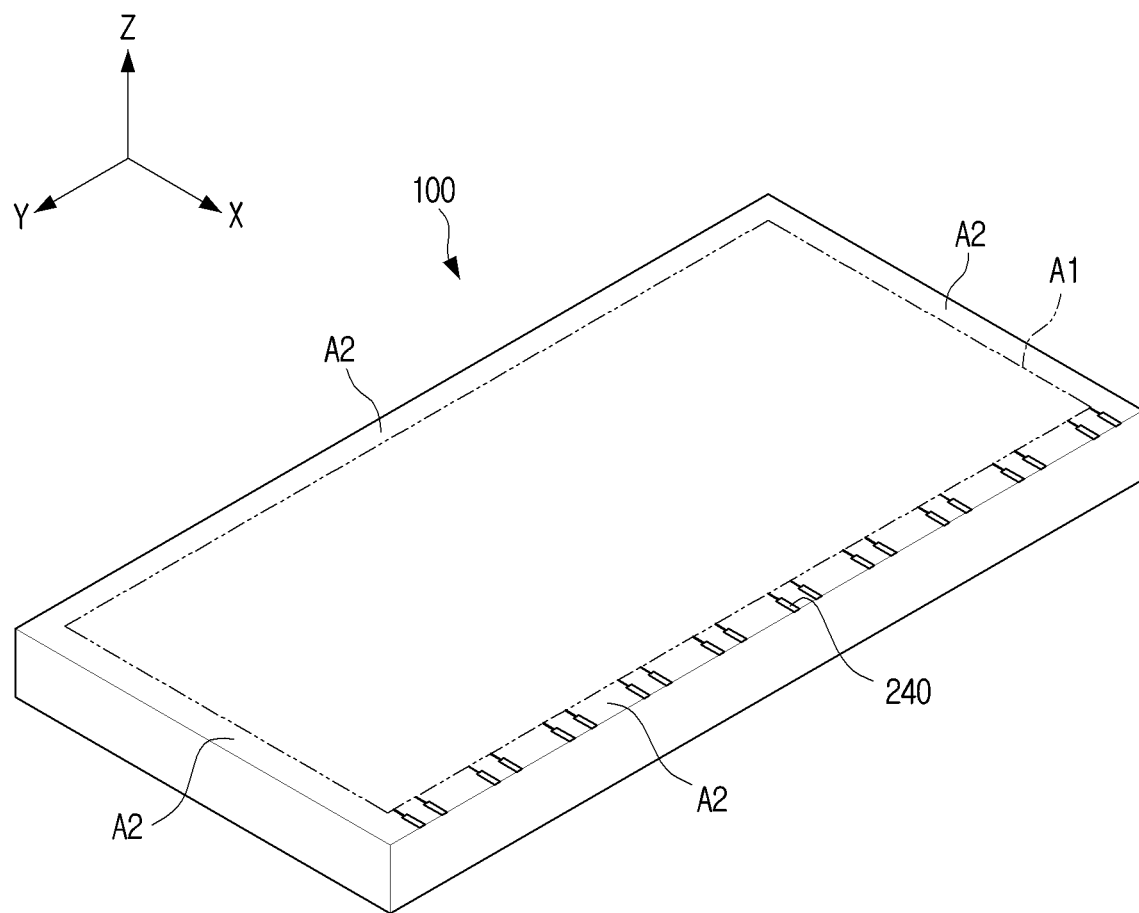
FIG. 10B is a view illustrating an active area and an inactive area on the glass substrate.

FIG. 10A is a flowchart illustrating a main process of manufacturing a display module according to the disclosure and FIG. 10B is a schematic view illustrating an active area and an inactive area on the glass substrate.

Referring to FIG. 10A, a TFT layer is formed on a front surface of the glass substrate 100 (S1).

The TFT layer may be formed in the form of a film in which the TFT circuit area 110 (e.g., see FIG. 1) for controlling an on/off of the LED, and the plurality of connection pads 130 (e.g., see FIG. 1) electrically connected to the horizontal line and the vertical line, respectively, formed in the TFT circuit area to transmit signals to the TFT circuit area are formed together. As such, the TFT layer formed in the form of a film may be coupled to the front surface of the glass substrate 100.

Referring to FIG. 10B, on the front surface of the glass substrate 100, the TFT circuit area of the TFT layer on which the LED is mounted may be defined as an active area A1, and the remaining area except the active area A1 may be defined as an inactive area A2. In this case, the inactive area A2 may be an edge portion in the front surface of the glass substrate 100 including an area occupied by the plurality of connection pads 130 of the TFT layer.

After the TFT layer is formed on the front surface of the glass substrate 100, the chamfered surfaces 121 and 123 (e.g., see FIG. 6) are formed by processing the corners included in the inactive area A2 of the glass substrate 100 (S2).

The chamfered surfaces 121 and 123 may be formed at each corner of the edge area of the glass substrate 100 in which the side wirings 240 (e.g., see FIG. 5) will be formed.

After the chamfered surfaces 121 and 123 are formed, the plurality of side wirings 240 electrically connected to the plurality of connection pads 130 disposed in the inactive area of the glass substrate in which the chamfered surfaces are formed are formed (S3). The plurality of connection pads 130 may be disposed only on the front surface of the glass substrate 100 (e.g., see FIG. 5), but are not limited thereto and may be disposed in the edge area of the back surface of the glass substrate 100 (e.g., see FIG. 14D).

The plurality of side wirings 240 formed on the side surface of the glass substrate 100 may not be connected to each other and may be disposed at constant intervals or at almost constant intervals. In addition, the number of the plurality of side wirings 240 may be equal to or less than the number of LEDs mounted on the TFT layer.

The plurality of side wirings 240 may be formed by one of a laser patterning process, a sputtering process, a pad printing process, and an ink screening process.

The laser patterning process may be a process of forming a metal film in the edge area of the glass substrate and then irradiating a laser beam to the metal film to leave a part of the metal film formed by the side wirings and removing the remainder.

The pad printing process may be a process of forming side wirings by transferring a plurality of conductive ribbons to be used as the side wirings on one side of a pad having elasticity, and then pressing the pad to the edge area of the glass substrate.

The ink screening process may be a process of forming side wirings by conductive ink formed in the edge area of the glass substrate through a plurality of exposed holes when the conductive ink is applied onto a mask film after the mask film having the plurality of exposed holes formed along patterns of the plurality of side wirings is formed in the edge area of the glass substrate.

The sputtering process is a process of forming side wirings in the edge area of the glass substrate through exposed holes by sputtering after forming a mask film having a plurality of exposed holes formed along patterns of a plurality of side wirings in the edge area of the glass substrate.

As such, when the plurality of side wirings 240 are formed in the edge area of the glass substrate 100, a plurality of LEDs are transferred from a wafer substrate on which the plurality of LEDs are arranged to the TFT layer of the glass substrate 100 (S4).

The LED transfer process may be performed through one of laser transfer, pick and place transfer, and roll transfer.

Hereinafter, a process of forming the plurality of side wirings 240 in the edge area 120 of the glass substrate 100 will be sequentially described with reference to FIGS. 11 and 12A to 12F.

Figure 11:
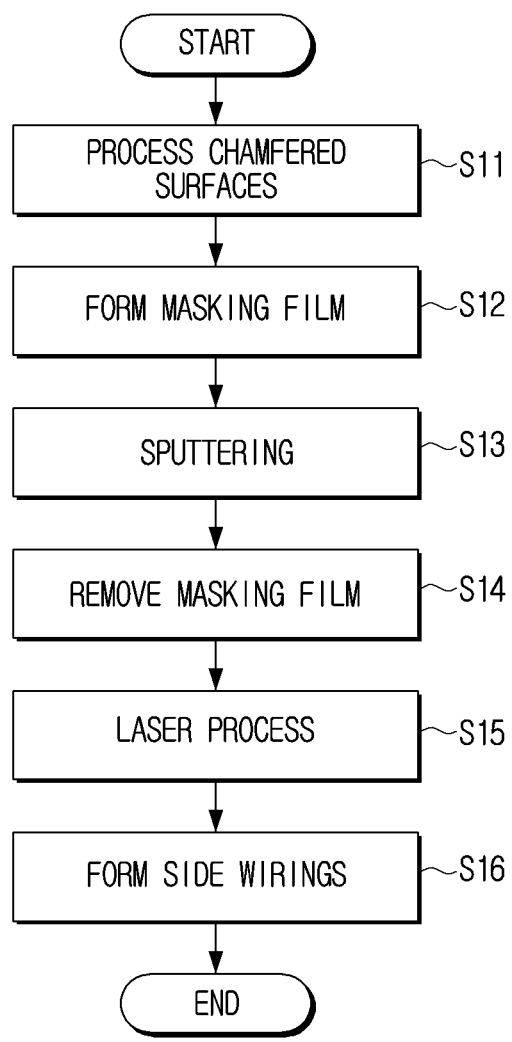
FIG. 11 is a flowchart illustrating a method for forming side wirings according to a first embodiment of the disclosure.

FIG. 11 is a flowchart illustrating a method for forming side wirings according to a first embodiment of the disclosure and FIGS. 12A to 12F are views sequentially illustrating a process of forming side wirings on the glass substrate according to the first embodiment of the disclosure.

Figure 12A:
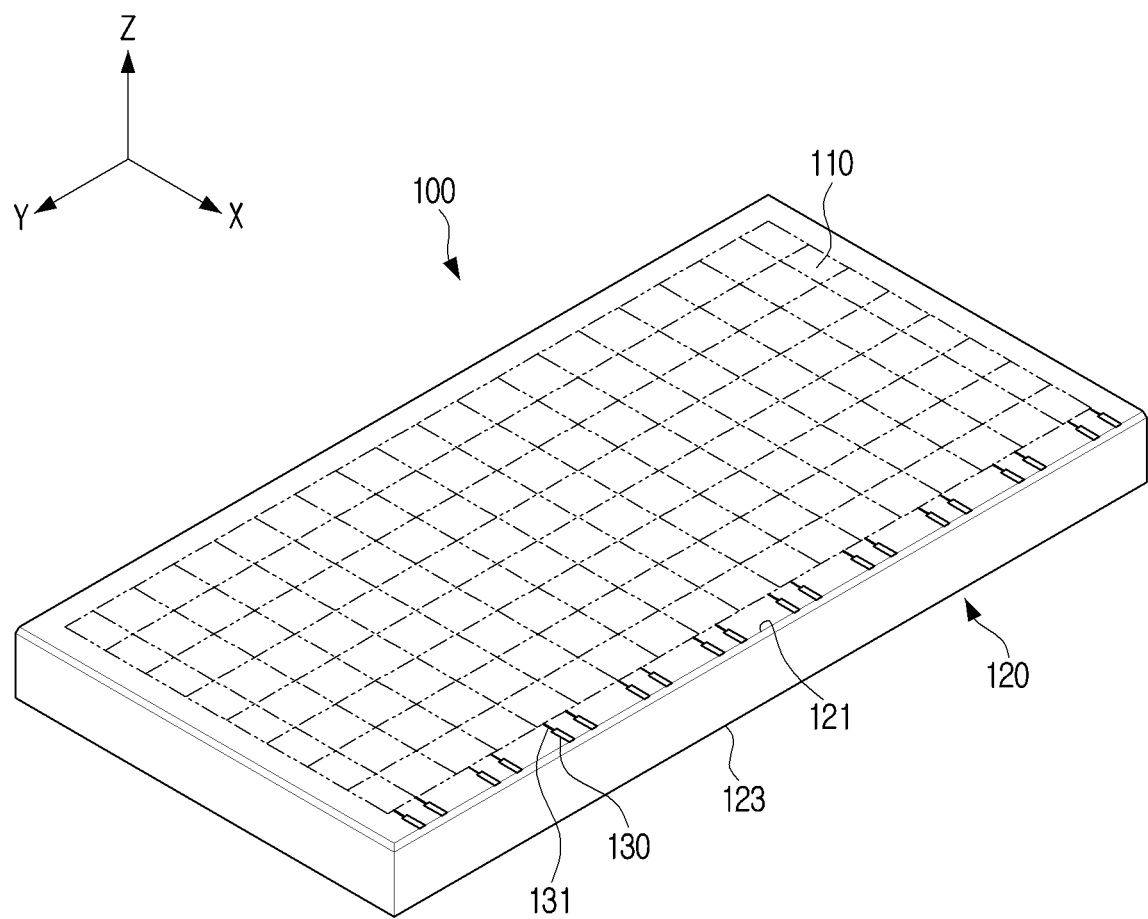
FIGS. 12A to 12F are views sequentially illustrating a process of forming side wirings on the glass substrate according to the first embodiment of the disclosure.

Referring to FIG. 12A, first and second chamfered surfaces 121 and 123 are formed in an edge area in which the side wirings 240 are formed among the edge areas of the glass substrate 100. The first and second chamfered surfaces 121 and 123 may be formed by grinding corners of the edge area 120 with a grinding device (not illustrated) (S11).

Surfaces of the first and second chamfered surfaces 121 and 123 may also be formed smoothly through a polishing process so that the side wirings 240 to be formed on the first and second chamfered surfaces 121 and 123 may be in close contact with the first and second chamfered surfaces 121 and 123 without being separated from the first and second chamfered surfaces 121 and 123.

Referring back to FIG. 12B, a masking film 210 is formed in the remaining area of the glass substrate 100 except for the edge area 120 of the glass substrate 100 (S12).

The masking film 210 may be formed to leave the edge area 120 in which the side wirings are to be formed and cover most of the glass substrate 100. The masking film 210 may be formed of an adhesive tape in the form of a film that is easily separated from the glass substrate 100 or may be formed by applying masking ink.

Figure 12B:
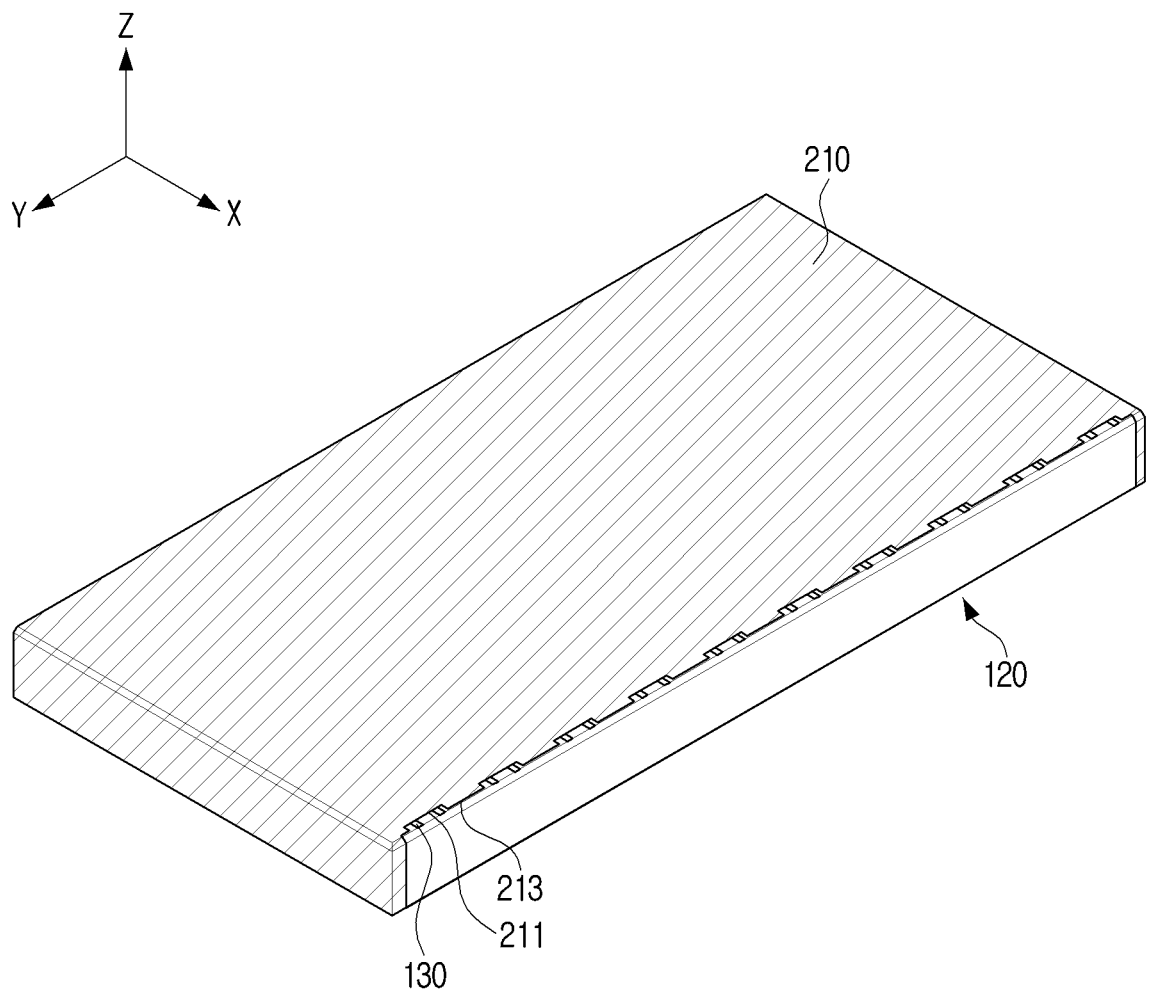

In an embodiment, the masking film 210 is formed to cover an empty space between the connection pads 130 as illustrated in FIG. 12B. This may reduce a total processing time by reducing a removal area of a metal film 230 when the process of removing a portion of the metal film 230 (e.g., see FIG. 12C) is performed with a laser beam in the future.

Figure 12C:
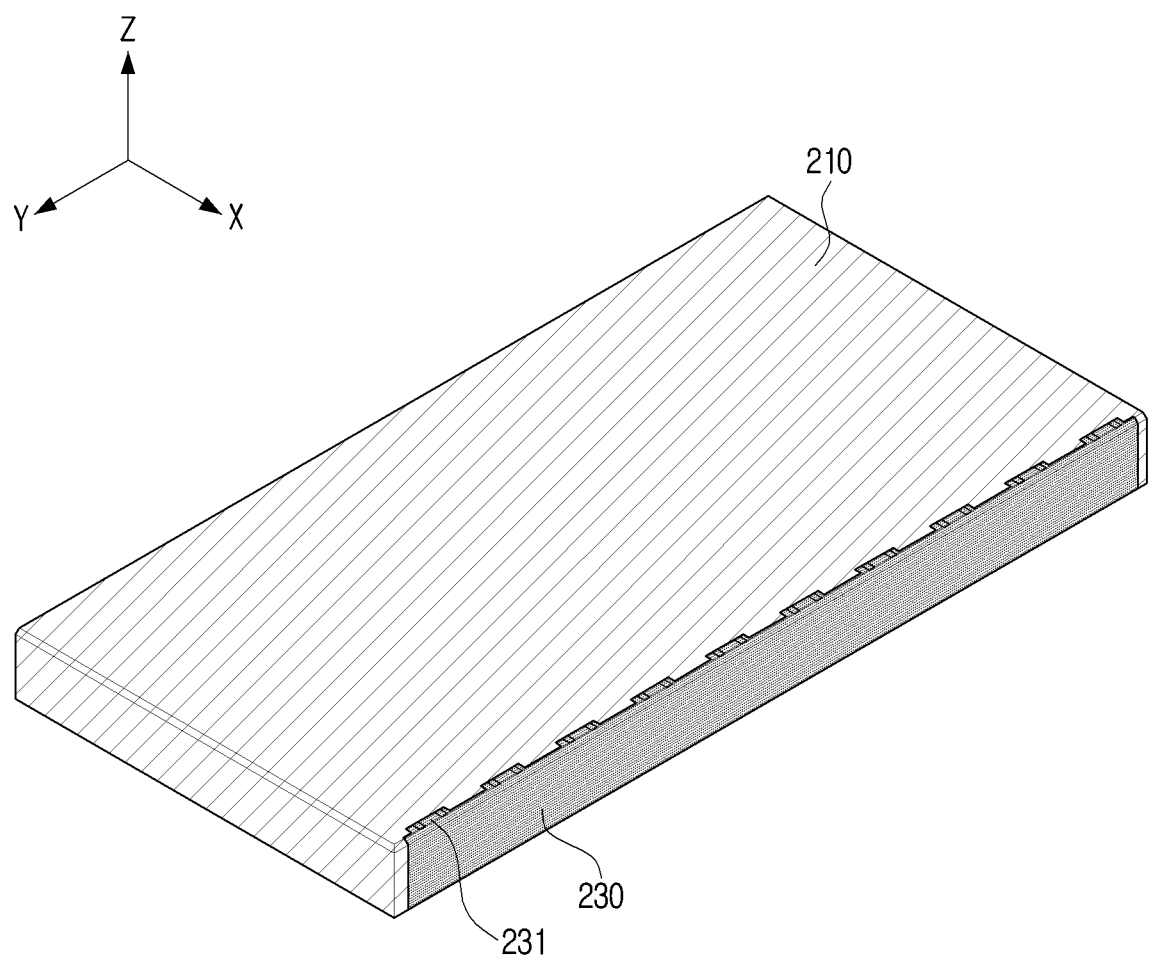

Referring to FIG. 12C, the glass substrate 100, which is not covered by the masking film 210, is placed in a vacuum chamber (not illustrated) and sputtered in a vacuum atmosphere to form the metal film 230 having a predetermined thickness in the edge area 120 (S13).

Figure 12D:
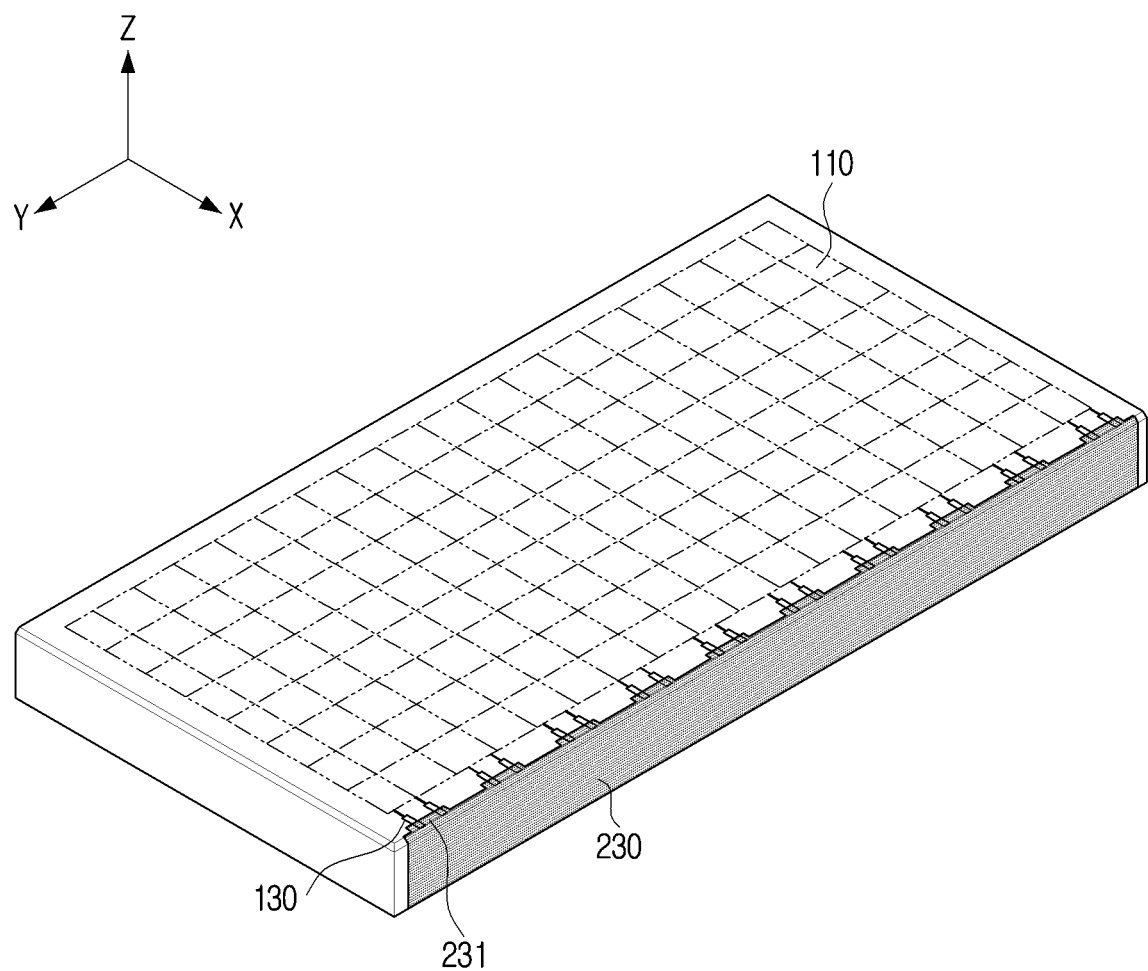

Referring to FIG. 12D, when the formation of the metal film 230 is completed, the masking film 210 may be removed from the glass substrate 100 (S14).

Figure 12E:
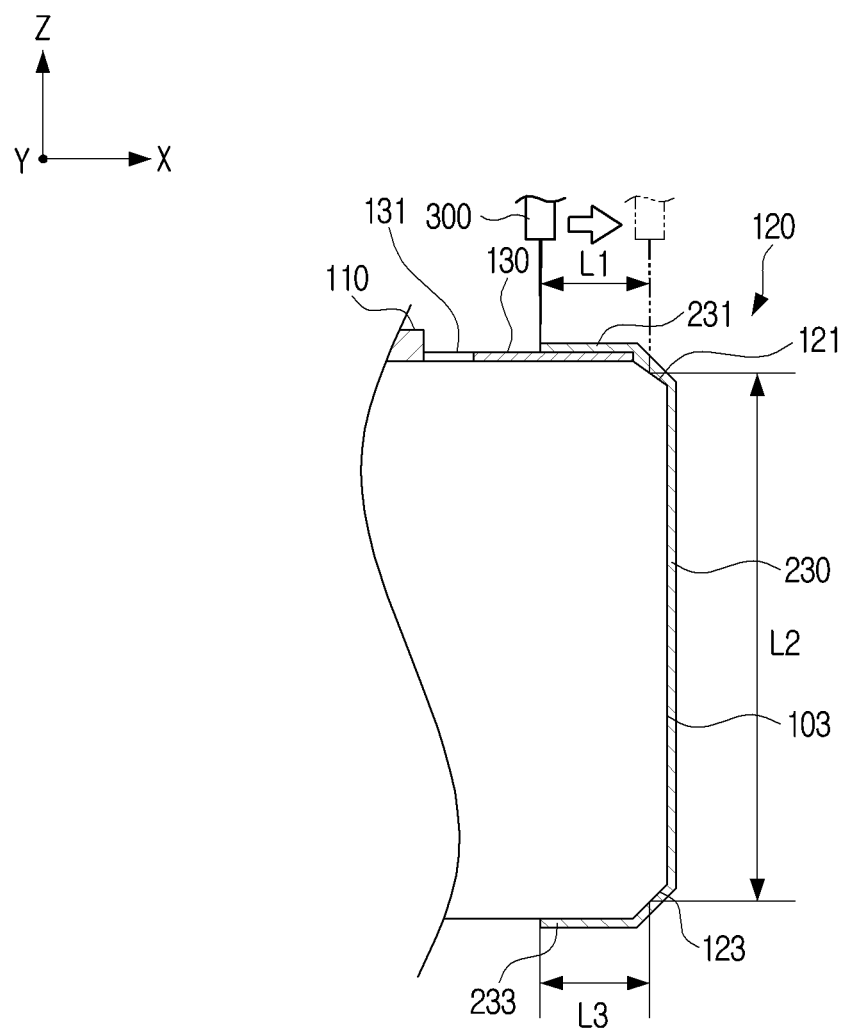

Referring to FIG. 12E, using a laser beam irradiated from a laser beam irradiator 300 of a laser beam device (not illustrated), a portion to be used as the side wiring in the entire metal film 230 remains and the remaining portion is removed (S15).

In this case, the laser beam irradiator 300 moves to a processing start position and then irradiates the laser beam while moving a distance L1 from a tip of one end portion 231 of the metal film 230 to a substantially middle portion of the first chamfered surface 121 toward the side surface 103 of the glass substrate 100 along an X axis direction to remove a portion of the metal film 230.

Subsequently, the glass substrate 100 is rotated by 90 degrees counterclockwise about a Y axis, and a position of the laser beam irradiator 300 is then set. The set position may be a position at which the metal film may be removed after the portion previously processed on the metal film 230.

If the position of the laser beam irradiator 300 is set, the laser beam irradiator 300 irradiates the laser beam while moving a distance L2 from the substantially middle portion of the first chamfered surface 121 to a substantially middle portion of the second chamfered surface 123 along the X axis direction to remove another portion of the metal film 230.

If the removal of another portion of the metal film 230 on the side surface 103 of the glass substrate 100 is completed, the glass substrate 100 is rotated again by 90 degrees counterclockwise about the Y axis, and the position of the laser beam irradiator 300 is then set.

If the position of the laser beam irradiator 300 is set, the laser beam irradiator 300 irradiates the laser beam while moving a distance L3 from the substantially middle portion of the second chamfered surface 123 to a tip of a back end portion 233 of the metal film 230 to remove the remaining portion of the metal film 230.

Meanwhile, although the laser beam irradiator 300 is irradiated with the laser beam while moving in the X-axis direction during the metal film processing, the disclosure is not limited thereto and it is also possible to remove the metal film 230 by irradiating the laser beam from the laser beam irradiator 300 while the laser beam irradiator 300 is fixed and the glass substrate 100 is moved by a predetermined distance along the X axis.

In addition, in the above description, although it is described that the metal film 230 is removed while rotating the glass substrate 100 at a predetermined angle using one laser beam irradiator 300, but the disclosure is not limited thereto and a portion of the metal film 230 may be removed using a laser beam irradiator for irradiating the laser beam toward the front surface of the glass substrate and an additional laser beam irradiator (not illustrated) for irradiating the laser beam toward the side surface of the glass substrate.

In this case, the process of removing the metal film 230 may be performed in a state in which the front surface of the glass substrate 100 is fixed to face upward as illustrated in FIG. 11A without the need to rotate the glass substrate 100.

The additional laser beam irradiator may irradiate a laser beam toward the metal film 230 while moving from a lower side to an upper side along a Z axis to remove another portion of the metal film 230. In this case, a movement upper limit of the additional laser beam irradiator is limited to the substantially middle portion of the first chamfered surface 121 to prevent the TFT circuit formed on the front surface 101 of the glass substrate 100 from being damaged by the laser beam irradiated from the additional laser beam irradiator.

In addition to the above-described method of processing the metal film 230, the metal film 230 may also be processed by fixing the glass substrate 100 to be inclined at a predetermined angle and moving the laser beam irradiator 300 in a linear direction. In this case, the TFT circuit formed on the front surface of the glass substrate 100 may not be damaged by the laser beam by appropriately setting the inclination angle of the glass substrate.

Figure 12F:
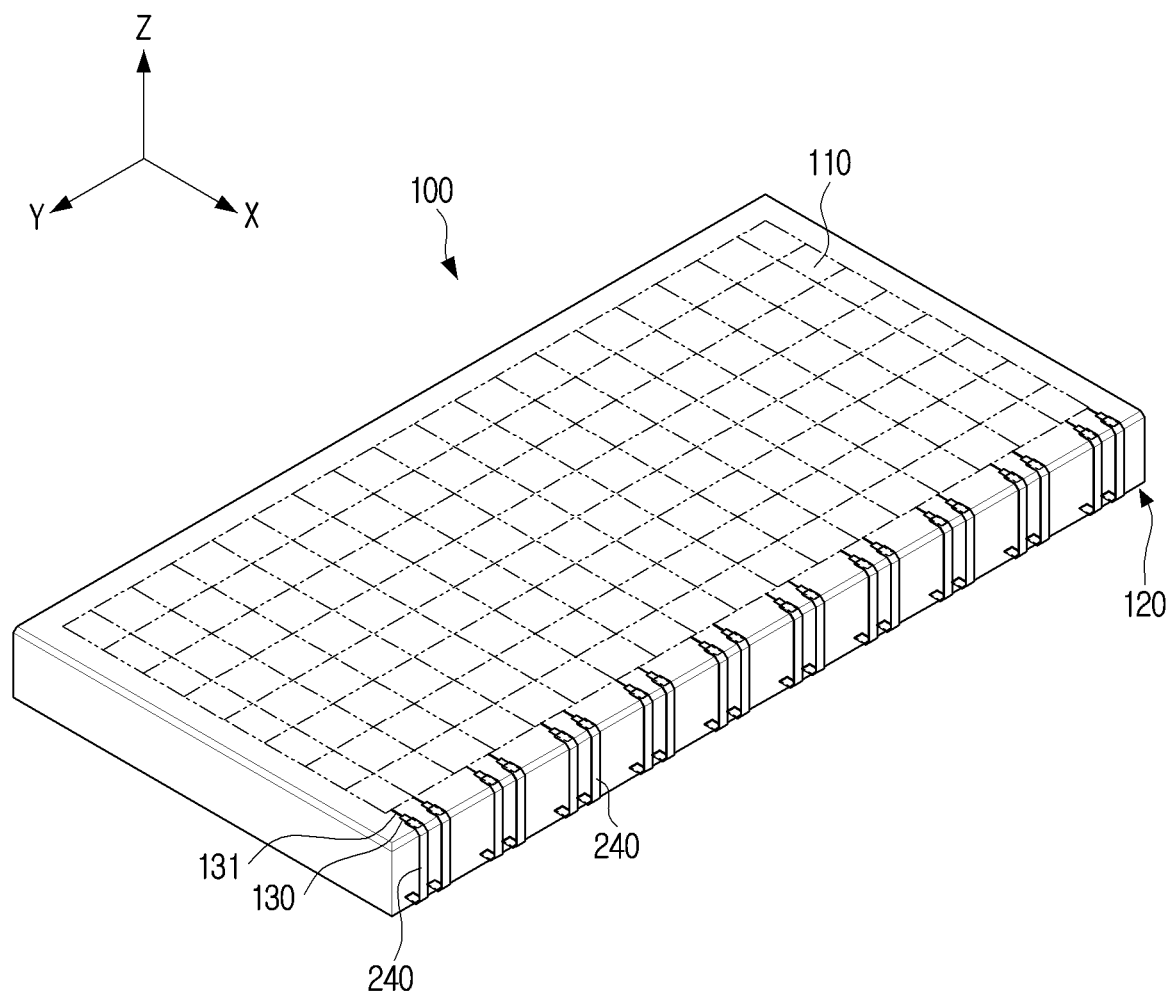

When the laser beam processing operation is completed so that only the portions to be used as the side wirings in the entire metal film 230 are left, the plurality of side wirings 240 may be formed in the edge area 120 of the glass substrate 100 as illustrated in FIG. 12F (S16).

Because the first and second chamfered surfaces are formed in the edge area of the glass substrate according to the embodiment of the disclosure, there are advantages as described below in terms of processability.

In a case in which there is a sharp rectangular corner with no chamfered surface in the edge area, masking using an adhesive tape in the form of a film has a problem that it is difficult to adhere the adhesive tape to the rectangular corner of the edge area due to the low flexibility of the adhesive tape, and masking using masking ink has a problem that agglomeration occurs severely at the corner portion. On the contrary, when the chamfered surface is formed in the edge area 120, the adhesive tape may be easily adhered and an agglomeration phenomenon of the masking ink may be significantly reduced as compared with the case in which there is no chamfered surface in the edge area.

In the case in which the metal film 230 is patterned by irradiating the laser beam to the side surface 103 of the glass substrate 100, because the laser beam is processed only to a specific area of the first chamfered surface 121 without processing the front surface of the glass substrate having the TFT circuit, it is possible to fundamentally prevent the damage of the TFT circuit due to the laser beam.

The sputtering process for forming the metal film 230 in the edge area 120 is performed after arranging a target (not illustrated) and a deposition surface (the side surface 103 of the glass substrate 100) perpendicular to each other. In this case, in the case in which there is no chamfered surface in the edge area, at the time of side sputtering, there is a problem that metal deposition is not performed properly or metal is not deposited to a desired thickness in the edge areas existing in the front surface and the back surface of the glass substrate. However, in the case in which there is the chamfered surface in the edge area as in the embodiment of the disclosure, because metal deposition is performed to the chamfered surface to a desired thickness, the side wirings 240 formed by being patterned from the metal film 230 may have good quality.

Hereinafter, diverse side wiring forming methods for forming side wirings on the glass substrate 100 in a method different from the method for forming side wirings according to the first embodiment of the disclosure described above will be described.

Figure 13:
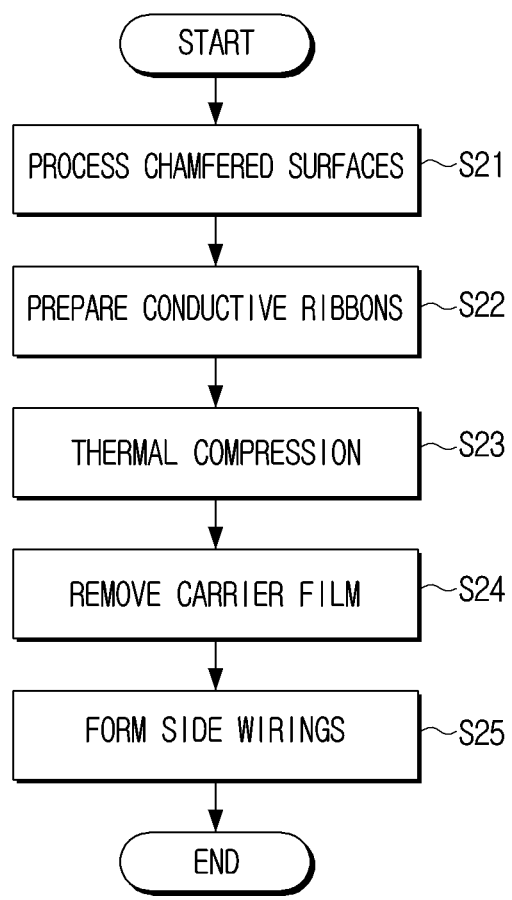
FIG. 13 is a flowchart illustrating a method for forming side wirings according to a second embodiment of the disclosure.

FIG. 13 is a flowchart illustrating a method for forming side wirings according to a second embodiment of the disclosure and FIGS. 14A to 14D are views sequentially illustrating a process of forming side wirings on the glass substrate according to the second embodiment of the disclosure.

First, the first and second chamfered surfaces 121 and 123 may be formed in edge areas in which the side wirings 240 are to be formed among the edge areas of the glass substrate 100. The first and second chamfered surfaces 121 and 123 may be formed by grinding the corners of the edge area 120 (e.g., see FIG. 1) with a grinding device (not illustrated) as described above (S21). In this case, surfaces of the first and second chamfered surfaces 121 and 123 may also be formed smoothly through a polishing process so that the side wirings 240 to be formed on the first and second chamfered surfaces 121 and 123 may be closely adhered to the first and second chamfered surfaces 121 and 123 without being separated from the first and second chamfered surfaces 121 and 123.

Figure 14A:
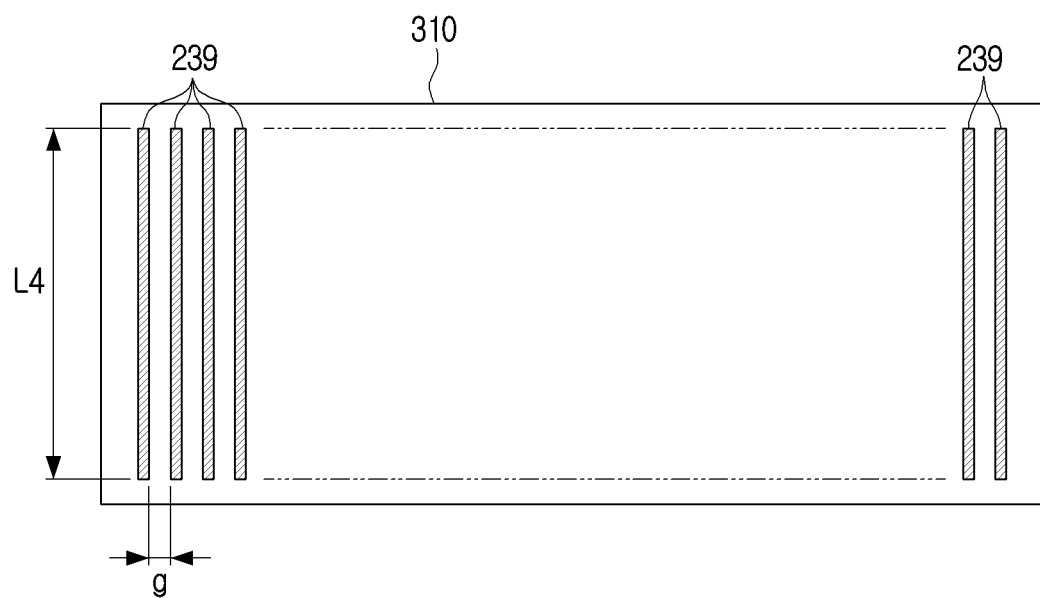
FIGS. 14A to 14D are views sequentially illustrating a process of forming side wirings on the glass substrate according to the second embodiment of the disclosure.
Figure 14B:
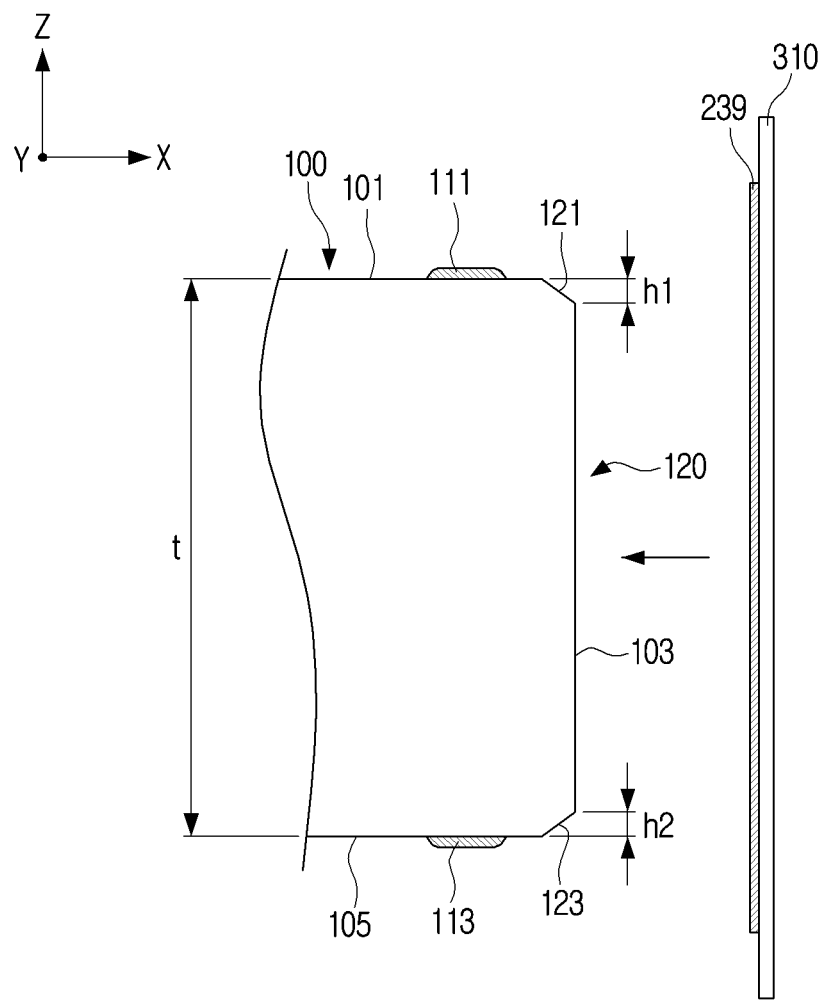

In this case, as illustrated in FIG. 14B, a height h1 of the first chamfered surface 121 may be less than about 20% with respect to a thickness t of the glass substrate 100, and a height h2 of the second chamfered surface 123 may also be less than about 20% with respect to the thickness t of the glass substrate 100. For example, when the thickness of the glass substrate is about 500 μm, the heights h1 and h2 of the first and second chamfered surfaces 121 and 123 may be about 1 to 40 μm, respectively.

In addition, the heights h1 and h2 of the first and second chamfered surfaces 121 and 123 may be the same or different. When the heights h1 and h2 of the first and second chamfered surfaces 121 and 123 are different, the height h1 of the first chamfered surface 121 may be smaller than the height h2 of the second chamfered surface 123. The heights h1 and h2 of the first and second chamfered surfaces 121 and 123 may be the same as or different from each other at less than 10% with respect to the thickness t of the glass substrate 100. For example, the height h1 of the first chamfered surface 121 may be 20±10 μm, and the height h2 of the second chamfered surface 123 may be 35±10 μm.

The thickness of the glass substrate 100 and the heights of the first and second chamfered surfaces 121 and 123 according to third to fifth embodiments described later, as well as the first embodiment described above, may also be formed in the same manner as the second embodiment.

After the first and second chamfered surfaces 121 and 123 are processed in the edge area of the glass substrate 100, a plurality of conductive ribbons 239 disposed on a carrier film 310 are prepared as illustrated in FIG. 14A (S22).

The plurality of conductive ribbons 239 are members used later as the side wirings 240 (e.g., see FIG. 14D), and may be made of a conductive metal material having a predetermined length and thickness. For example, the plurality of conductive ribbons 239 may be formed through a process of applying (or printing) silver paste to one surface of the carrier film 310 and curing the same for a predetermined time.

The plurality of conductive ribbons 239 may be disposed on the carrier film 310 at a constant width and gap g. The width and gap g of the plurality of conductive ribbons 239 may be formed in consideration of the gap of the plurality of first and second connection pads 111 and 113 (e.g., see FIG. 14B) disposed to be adjacent to the first and second chamfered surfaces 121 and 123, respectively, along the front surface 101 and the back surface 105 of the glass substrate 100.

The plurality of conductive ribbons 239 may be formed to have a length L4 to electrically connect the first and second connection pads 111 and 113.

Figure 14C:
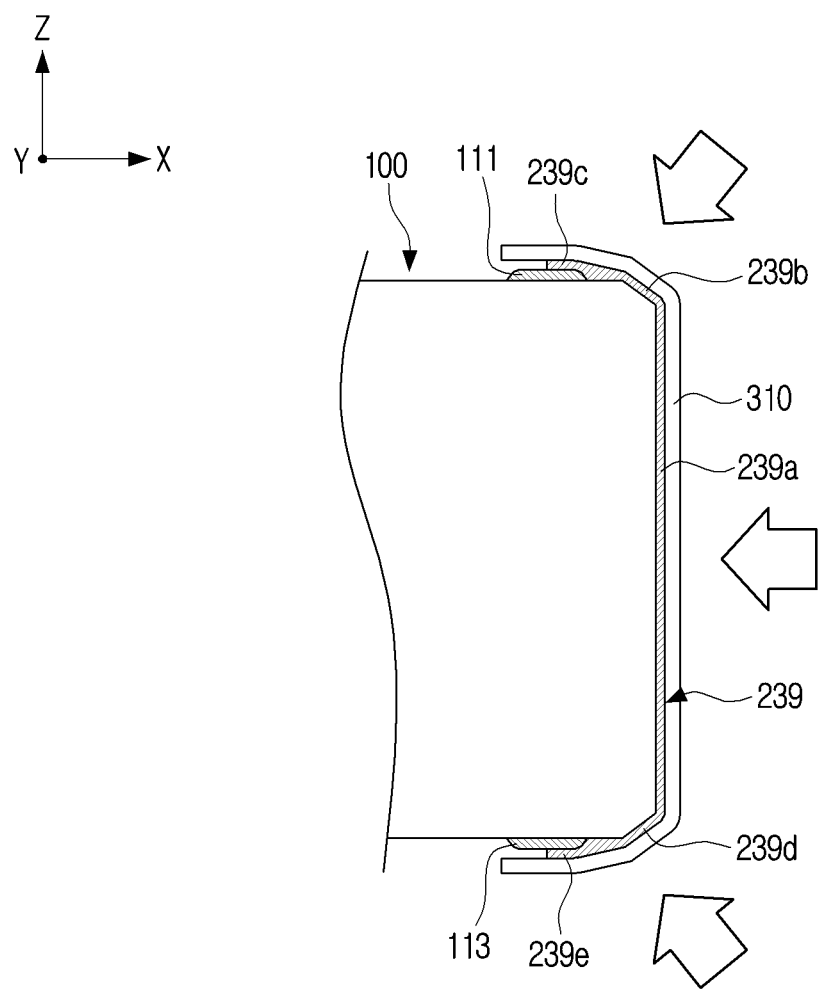

Referring to FIG. 14B, after the carrier film 310 is disposed so that the plurality of conductive ribbons 239 face the edge area of the glass substrate 100, a thermal compression process is performed on the edge area of the glass substrate 100 so that the conductive ribbons 239 are connected to the first and second connection pads 111 and 113 as illustrated in FIG. 14C (S23).

In this case, the carrier film 310 is pressed to a predetermined temperature in various directions such that a back surface of the carrier film 310 surrounds the edge area of the glass substrate 100.

Figure 14D:
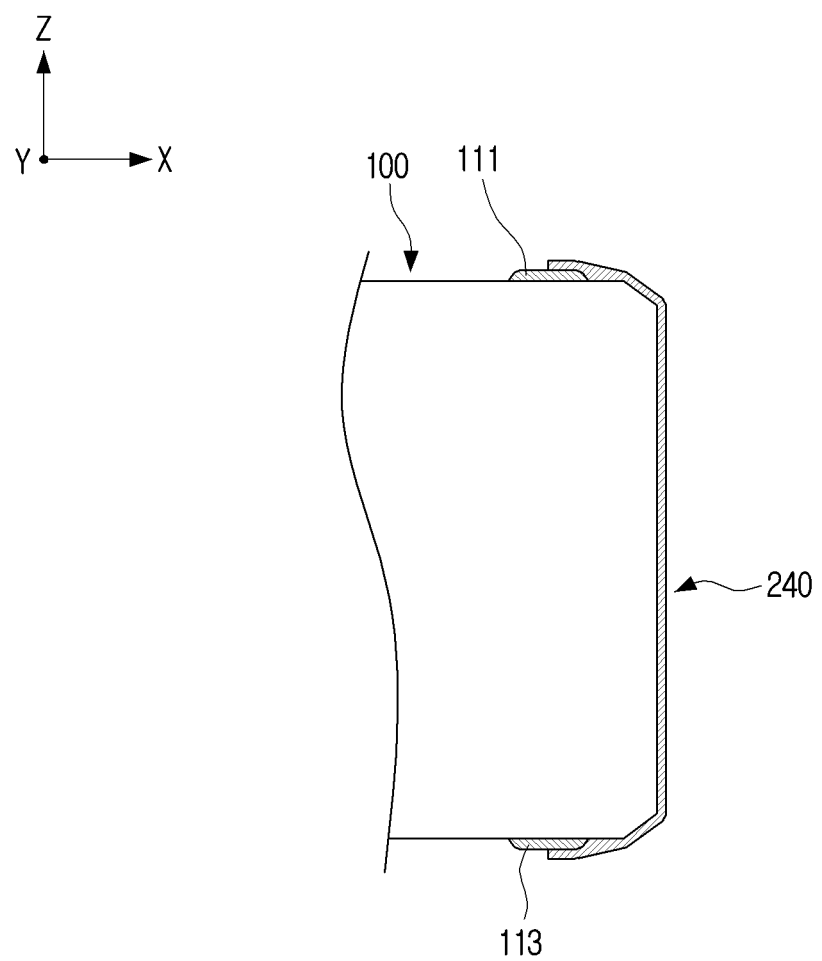

The plurality of conductive ribbons 239 may be physically and firmly attached to the first and second connection pads 111 and 113 by covering the first and second connection pads 111 and 113 with an upper end portion 239c and a lower end portion 239e, respectively, through the thermal compression process, and the remaining portions 239a, 239b, 239d of the conductive ribbons 239 may be firmly attached to the side surface 103 of the glass substrate 100 and the first and second chamfered surfaces 121 and 123, respectively. When the carrier film 310 is removed, the plurality of conductive ribbons 239 remain in the edge area of the glass substrate 100 as illustrated in FIG. 14D, and the plurality of conductive ribbons 239 may be cured by heating to a predetermined temperature for a predetermined time or may be cured at room temperature to form side wirings 240 (S25).

Figure 15:
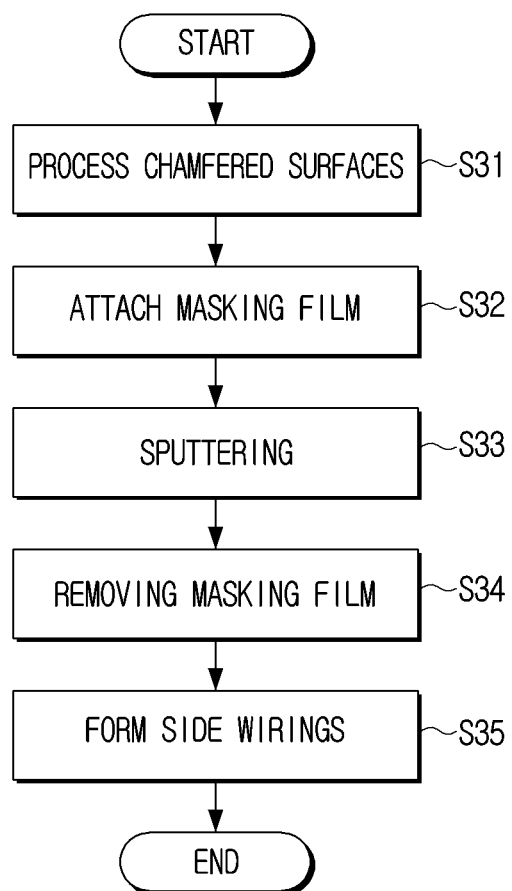
FIG. 15 is a flowchart illustrating a method for forming side wirings according to a third embodiment of the disclosure.

FIG. 15 is a flowchart illustrating a method for forming side wirings according to a third embodiment of the disclosure and FIGS. 16A to 16E are views sequentially illustrating a process of forming side wirings on the glass substrate according to the third embodiment of the disclosure.

Similarly to the first embodiment described above, a method for forming side wirings according to the third embodiment of the disclosure also forms the first and second chamfered surfaces 121 and 123 by processing the corners of the edge area of the glass substrate (S31).

Figure 16A:
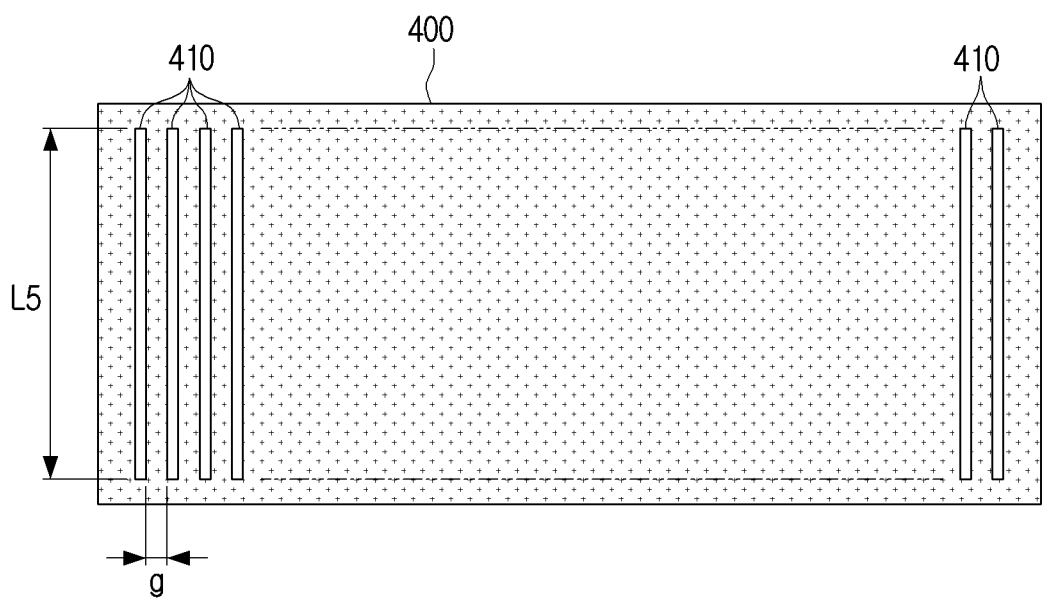
FIGS. 16A to 16E are views sequentially illustrating a process of forming side wirings on the glass substrate according to the third embodiment of the disclosure.
Figure 16B:
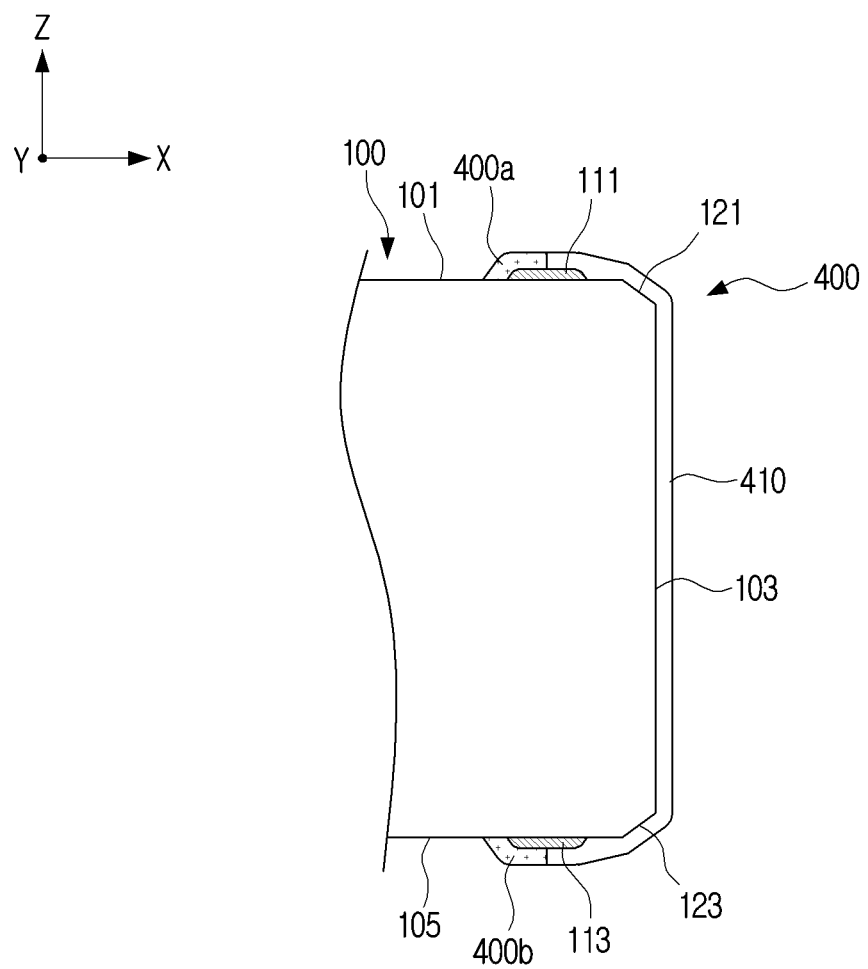

Subsequently, a mask film 400 having a plurality of exposed holes 410 as illustrated in FIG. 16A is formed in the edge area of the glass substrate 100 as illustrated in FIG. 16B (S32).

In this case, the mask film 400 may be formed by applying liquid non-conductive ink to the edge area of the glass substrate 100 by, for example, screen printing.

In addition, the mask film 400 may be formed by mechanically or laser-processing a tape or film made of resin or metal, and a photosensitive film may be exposed, developed and manufactured, and then attached to the edge area of the glass substrate.

Figure 16C:
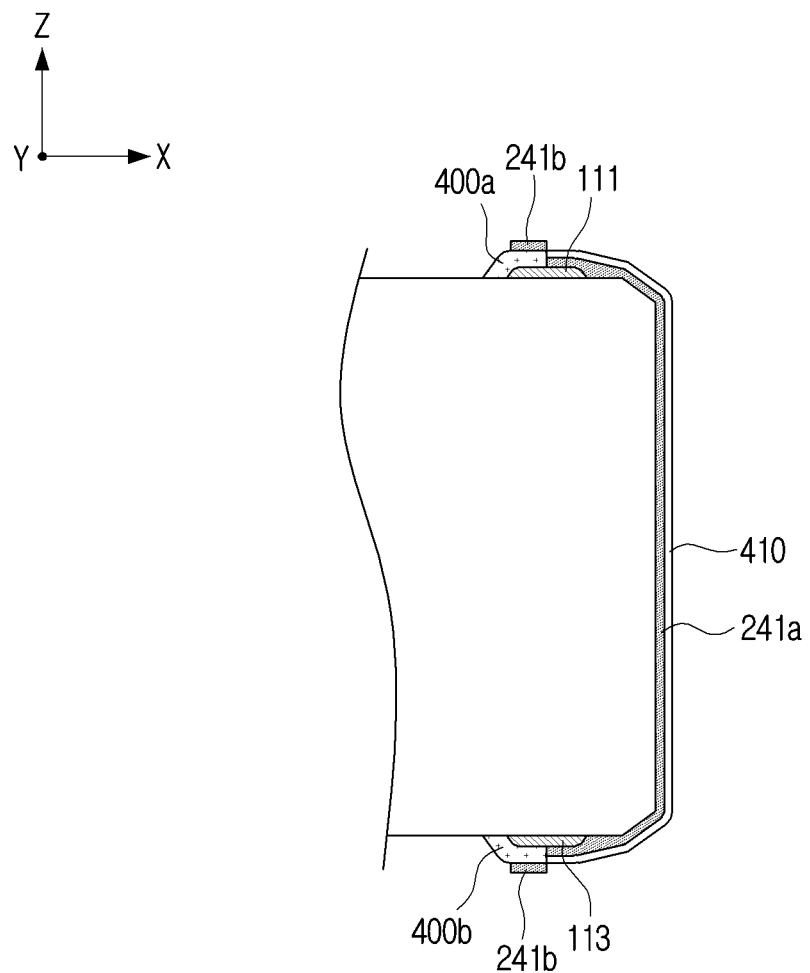
Figure 16D:
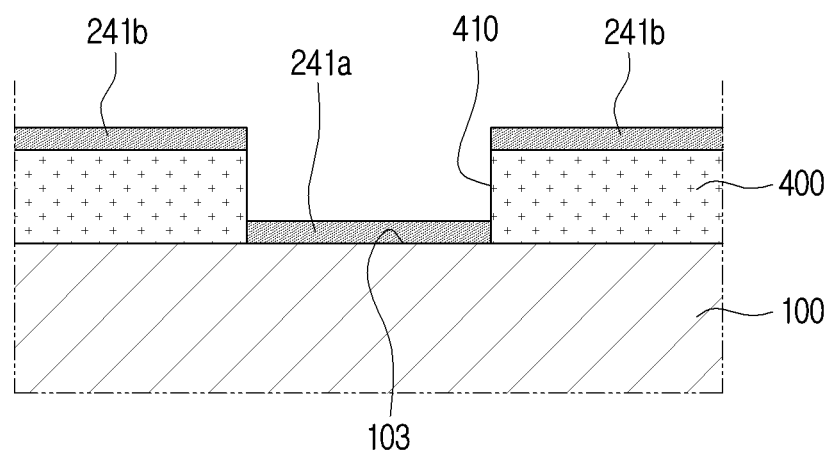
Figure 16E:
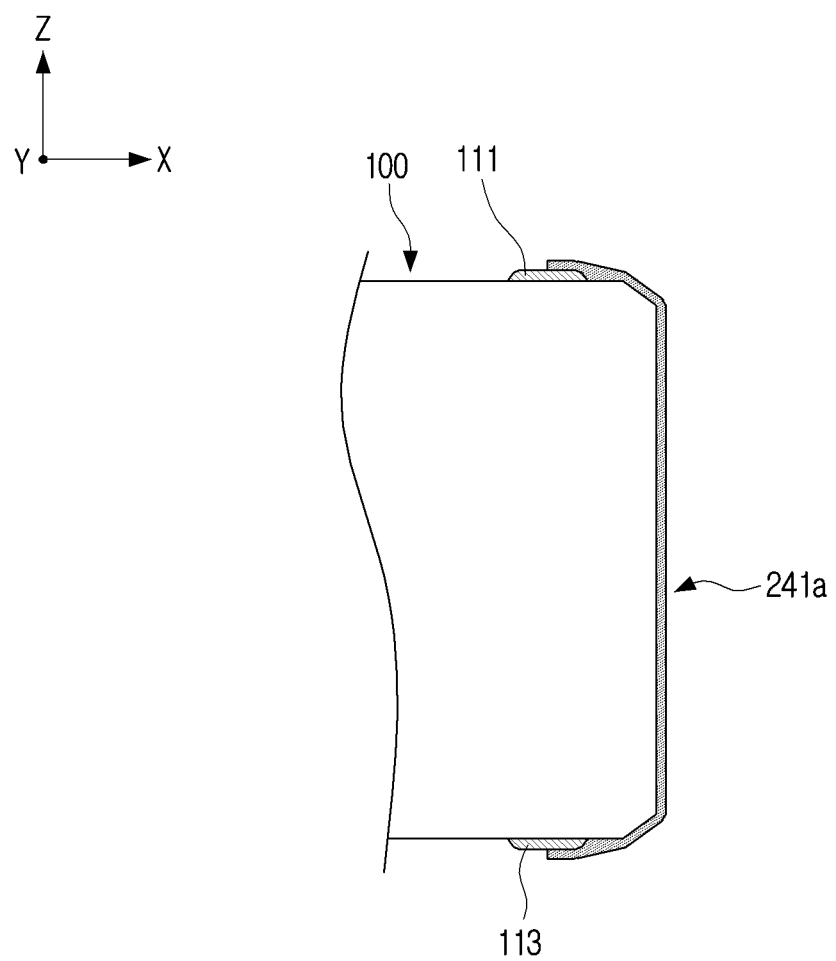

The plurality of exposed holes 410 may be formed in consideration of the shape of the side wirings as holes for forming the side wirings 242 (e.g., see FIG. 16E). For example, the constant width and gap g of the plurality of exposed holes 410 are formed in consideration of the gap of the plurality of connection pads 111 and 113 disposed to be adjacent to the first and second chamfered surfaces 121 and 123, respectively, along the front surface 101 and the back surface 105 of the glass substrate 100.

The plurality of exposed holes 410 may be formed to have a length L5 such that the side wirings 242 may electrically connect the first and second connection pads 111 and 113.

Referring to FIG. 16B, the mask film 400 formed in the edge area of the glass substrate 100 is disposed so that an upper end portion 400a and a lower end portion 400b completely cover the first and second connection pads 111 and 113, respectively.

In this case, portions of the first and second connection pads 111 and 113, the side surface 103 of the glass substrate, and the first and second chamfered surfaces 121 and 123 may be simultaneously exposed through the exposed holes 410. Accordingly, the shape of the side wiring 242 to be formed later may be the same as the shape of the exposed hole 410.

Referring to FIG. 16C, after the mask film 400 is formed, a sputtering process is performed so that a metal film 241a may be deposited and formed on portions corresponding to the plurality of exposed holes 410 (S33).

When the sputtering process is performed, the metal film 241a is deposited and formed on the exposed portions in the edge area of the glass substrate 100 through the plurality of exposed holes 410 as illustrated in FIGS. 16C and 16D, and a metal film 241b may also be deposited and formed on a surface of the mask film 400.

Thereafter, the mask film 400 may be removed from the edge area of the glass substrate 100 by using a solvent capable of melting the mask film 400 or by heating the mask film 400 with heat of a predetermined temperature (S34).

Accordingly, when the mask film 400 and the metal film 241b formed on the surface of the mask film 400 are separated from the glass substrate 100, the metal film 241a deposited in the edge area of the glass substrate 100 through the plurality of exposed holes 410 remains in the edge area of the glass substrate 100 as illustrated in FIG. 16E.

The metal film 241a may be used as the side wirings 242 that physically and electrically connect the first and second connection pads 111 and 113 (S35).

In the process of forming the side wirings according to the third embodiment of the disclosure, the sputtering process is performed after the mask film 400 is formed, but it is also possible to form the side wirings through an ink screening process instead of the sputtering process. In such an ink screening process, when conductive ink is applied to the entire mask film 400 and applied while applying a predetermined pressure with a scraper, the conductive ink may be formed in close contact with the edge area of the glass substrate through the plurality of exposed holes 410. The plurality of side wirings thus formed may have a predetermined hardness through a process of curing at room temperature or a temperature higher than room temperature.

Figure 17:
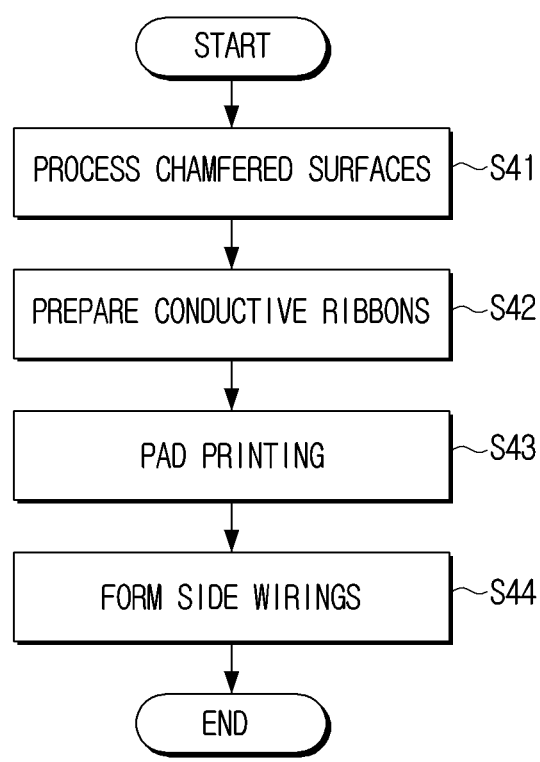
FIG. 17 is a flowchart illustrating a method for forming side wirings according to a fourth embodiment of the disclosure.

FIG. 17 is a flowchart illustrating a method for forming side wirings according to a fourth embodiment of the disclosure and FIGS. 18A to 18D are views sequentially illustrating a process of forming side wirings on the glass substrate according to the fourth embodiment of the disclosure.

Similarly to the first embodiment described above, a method for forming side wirings according to the fourth embodiment of the disclosure also forms the first and second chamfered surfaces 121 and 123 by processing the corners of the edge area of the glass substrate (S41).

Figure 18A:
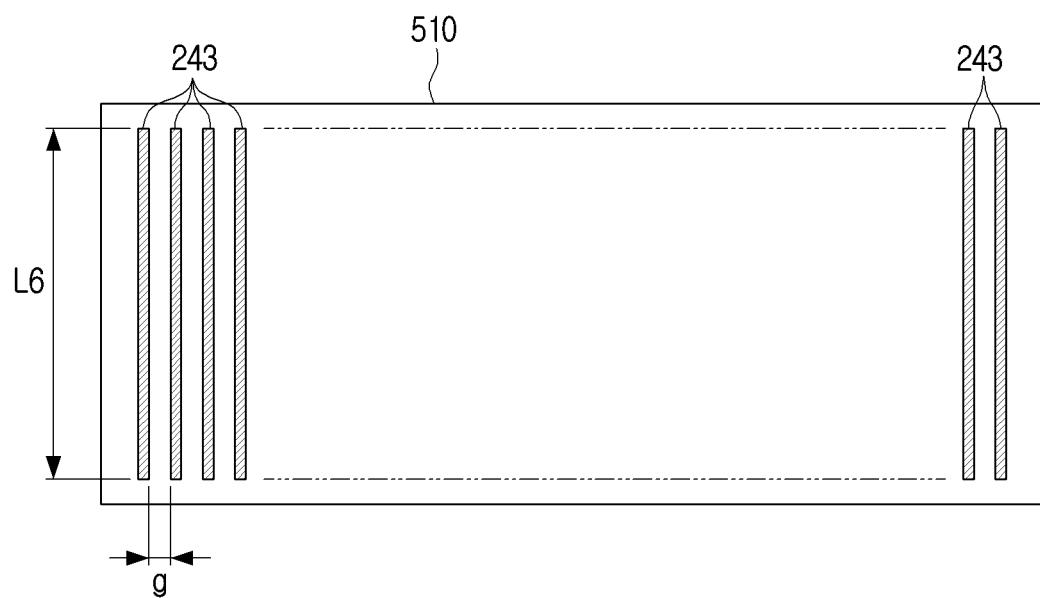
FIGS. 18A to 18D are views sequentially illustrating a process of forming side wirings on the glass substrate according to the fourth embodiment of the disclosure.

After the first and second chamfered surfaces 121 and 123 are processed in the edge area of the glass substrate 100 as described above, an ink transfer plate 510 having a plurality of recesses in which patterns such as a plurality of conductive ribbons 243 are formed is prepared as illustrated in FIG. 18A. Conductive ink is applied to the recesses of the ink transfer plate 510 and a three-dimensional pad 500 is pressed and adhered to the ink transfer plate 510 to transfer the conductive ink of the ink transfer plate 510 to the three-dimensional plate 500 such that the plurality of conductive ribbons 243 may be formed on one side surface of the three-dimensional pad 500 (S42). In this case, the plurality of conductive ribbons 243 may be disposed on the three-dimensional pad 500 at a constant width and gap g.

The width and gap g of the plurality of conductive ribbons 243 formed on the three-dimensional pad 500 may be formed in consideration of the gap of the plurality of connection pads 111 and 113 disposed to be adjacent to the first and second chamfered surfaces 121 and 123, respectively, along the front surface 101 and the back surface 105 of the glass substrate 100. The plurality of conductive ribbons 243 may be formed to have a length L6 to electrically connect the first and second connection pads 111 and 113.

The three-dimensional pad 500 may be formed in a shape having a predetermined volume and may be formed of a material having an elastic force that a shape is deformed by a force applied from the outside and then restored to an original form when the force is removed.

Figure 18B:
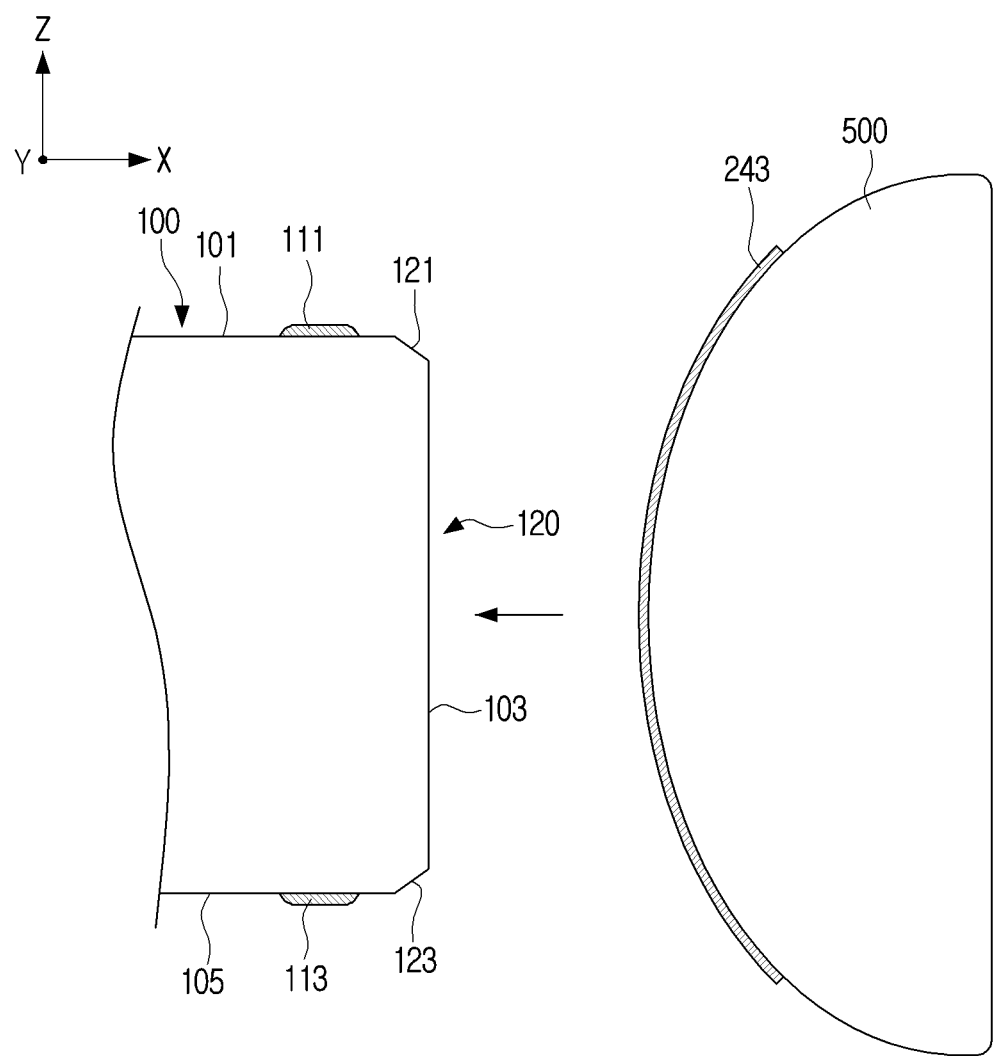
Figure 18C:
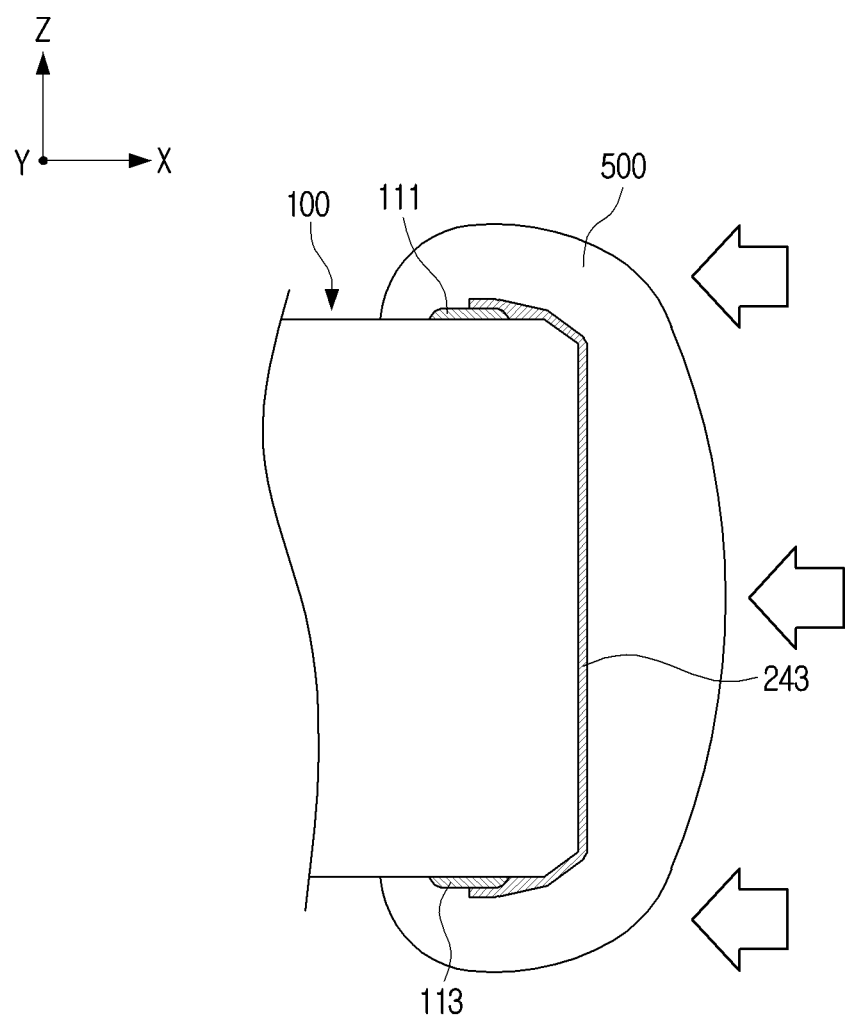

Referring to FIG. 18B, after the three-dimensional pad 500 is disposed so that the plurality of conductive ribbons 243 face the edge area of the glass substrate 100, a pad printing process of bringing the three-dimensional pad 500 into close contact with the edge area 120 of the glass substrate 100 and then pressing the three-dimensional pad 500 at a predetermined pressure is performed so that the plurality of conductive ribbons 243 are connected to the first and second connection pads 111 and 113 as illustrated in FIG. 18C (S43).

Through the pad printing process, the plurality of conductive ribbons 243, which are not fully cured, that is, may maintain their shape without flowing down, may be firmly attached to the edge area of the glass substrate 100, and may physically and electrically connect the first and second connection pads 111 and 113 at the same time.

Figure 18D:
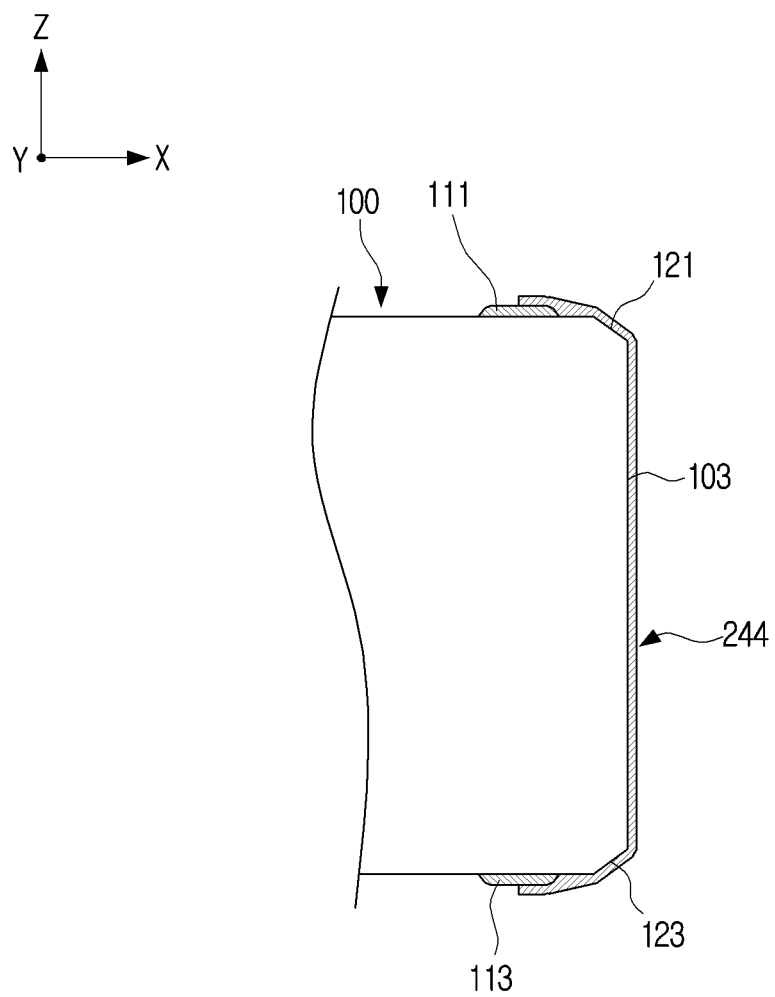

Subsequently, when the three-dimensional pad 500 is separated from the edge area of the glass substrate 100 while removing the pressure applied to the three-dimensional pad 500, the plurality of conductive ribbons 243 remain in the edge area 120 of the glass substrate 100 as illustrated in FIG. 18D. In this state, the plurality of conductive ribbons 243 may be cured by heating to a predetermined temperature for a predetermined time or cured at room temperature to form the side wirings 244 (S44).

Figure 19:
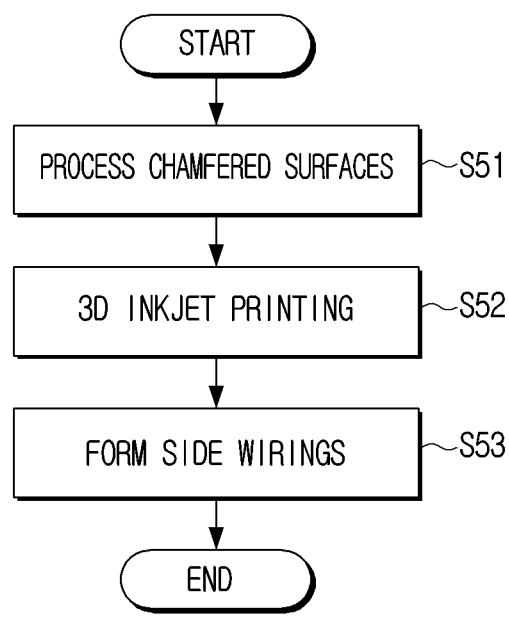
FIG. 19 is a flowchart illustrating a method for forming side wirings according to a fifth embodiment of the disclosure.

FIG. 19 is a flowchart illustrating a method for forming side wirings according to a fifth embodiment of the disclosure and FIGS. 20A to 20G are views sequentially illustrating a process of forming side wirings on the glass substrate according to the fifth embodiment of the disclosure.

Similarly to the first embodiment described above, a method for forming side wirings according to the fifth embodiment of the disclosure also forms the first and second chamfered surfaces 121 and 123 by processing the corners of the edge area of the glass substrate (S51).

Subsequently, conductive ink is applied to the edge area 120 of the glass substrate 100 through a three-dimensional (3D) inkjet printing method (S52). Hereinafter, a 3D inkjet printing process will be described with reference to FIGS. 20A to 20G.

Figure 20A:
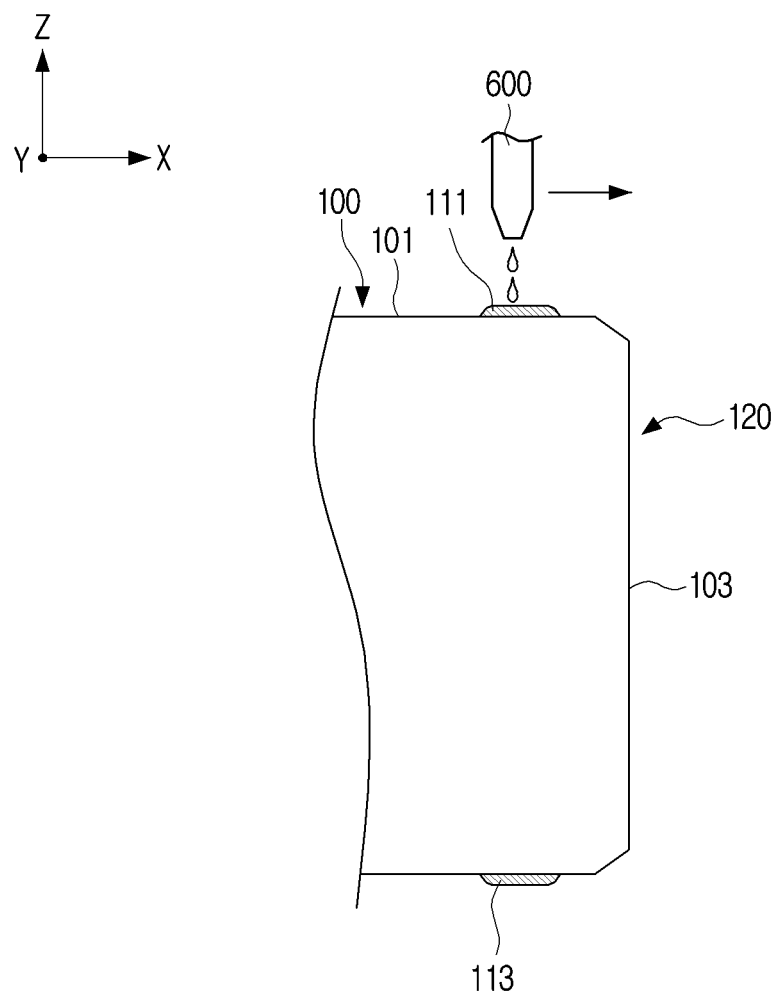
FIGS. 20A to 20G are views sequentially illustrating a process of forming side wirings on the glass substrate according to the fifth embodiment of the disclosure.

Referring to FIG. 20A, a nozzle 600 of a 3D inkjet printing apparatus (not illustrated) is set to an initial position. Here, for the convenience of description, the initial position of the nozzle 600 may be defined as a position located on the upper side of the first connection pad 111 with the upper surface 101 of the glass substrate 100 disposed toward the nozzle 600. The nozzle 600 may discharge liquid conductive ink while moving along the X, Y, and Z axes.

Figure 20B:
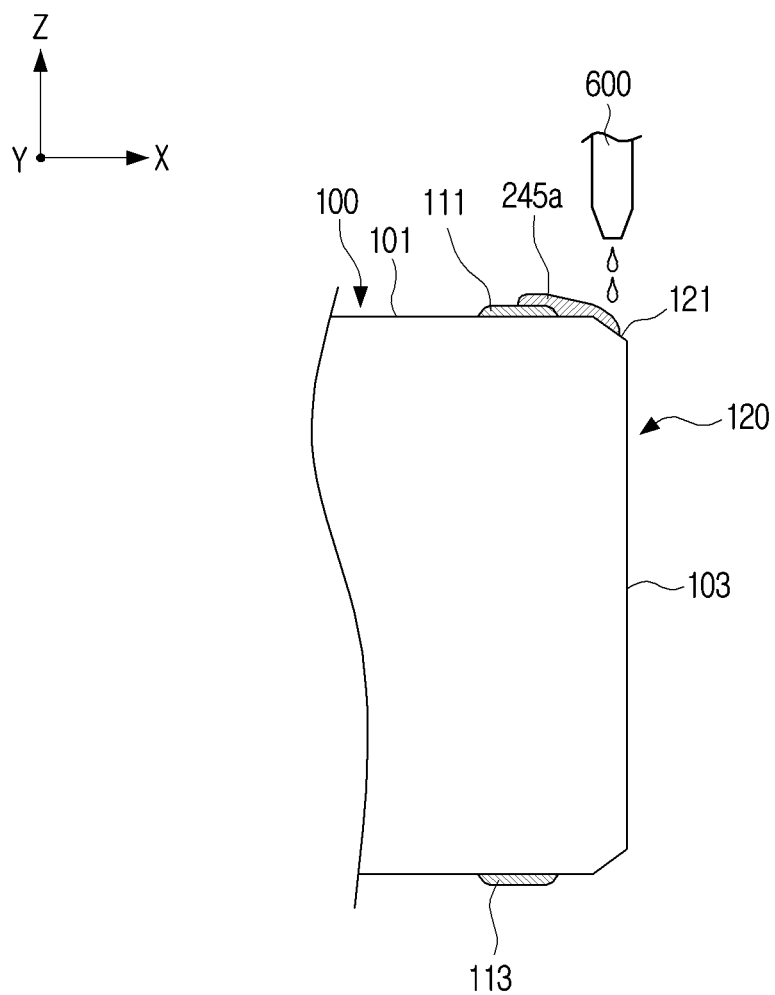

When the nozzle 600 is set to the initial position, the nozzle 600 discharges the conductive ink while moving toward the side surface 103 of the glass substrate 100, and discharges the conductive ink so as to cover a portion of the first connection pad 111 and the first chamfered surface 121 as illustrated in FIG. 20B. Accordingly, the conductive ink discharged from the nozzle 600 may form a first portion 245a forming a portion of the side wiring as illustrated in FIG. 20B.

Figure 20C:
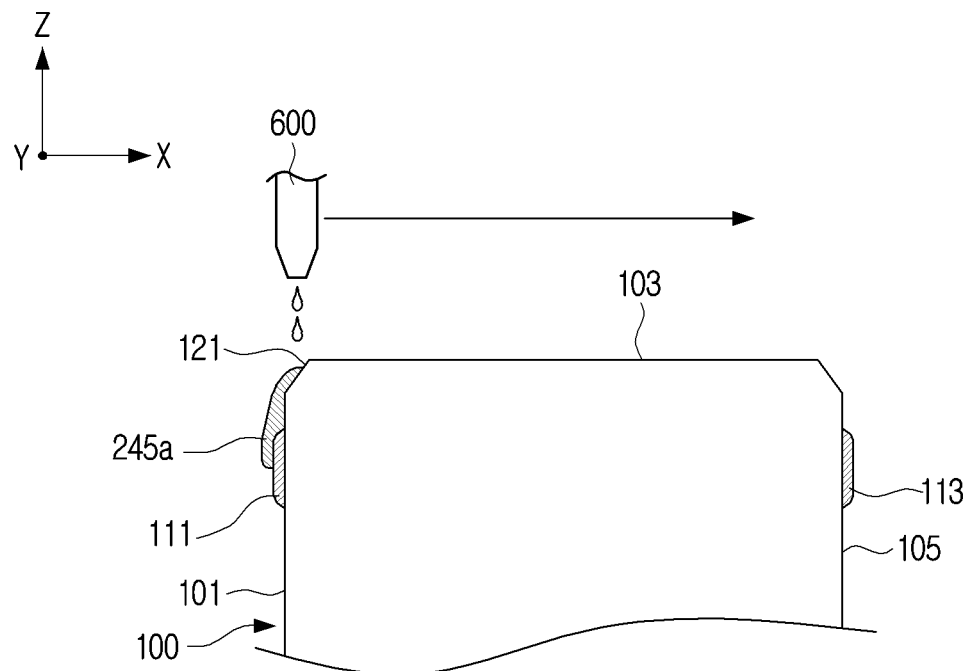

Subsequently, the glass substrate 100 is rotated by 90 degrees counterclockwise as illustrated in FIG. 20C. In this case, because the conductive ink has a predetermined viscosity, the first portion 245a may maintain its shape without flowing down.

Figure 20D:
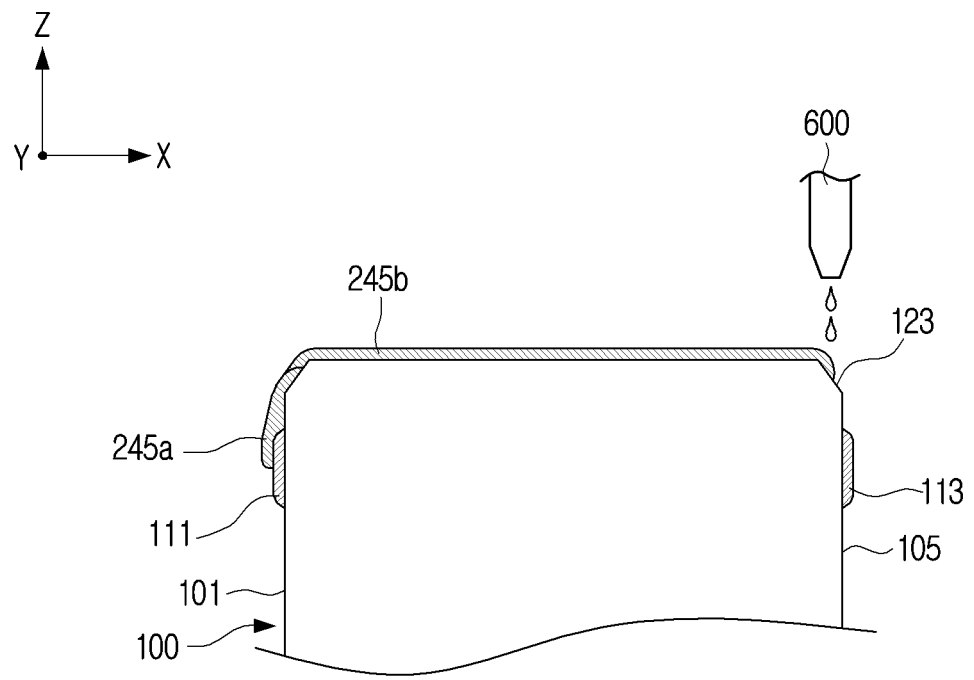

The nozzle 600 discharges the conductive ink while moving toward the back surface 105 of the glass substrate 100 from a position where an end portion of the first portion 245a may be covered or contacted and discharges the conductive ink so as to cover a portion of the second chamfered surface 123 as illustrated in FIG. 20D. Accordingly, the conductive ink discharged from the nozzle 600 may form a second portion 245b forming a portion of the side wiring.

Figure 20E:
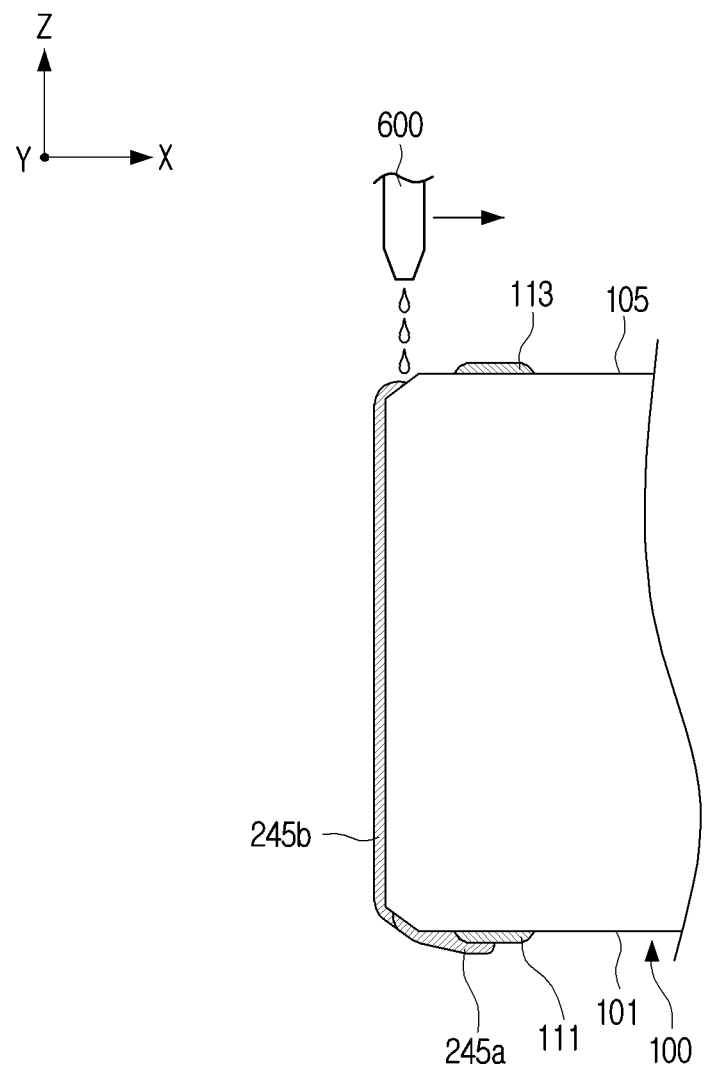

Subsequently, the glass substrate 100 is rotated by 90 degrees counterclockwise as illustrated in FIG. 20E. In this case, as the conductive ink has a predetermined viscosity, the first and portions 245a and 245b may maintain their shape without flowing down.

Figure 20F:
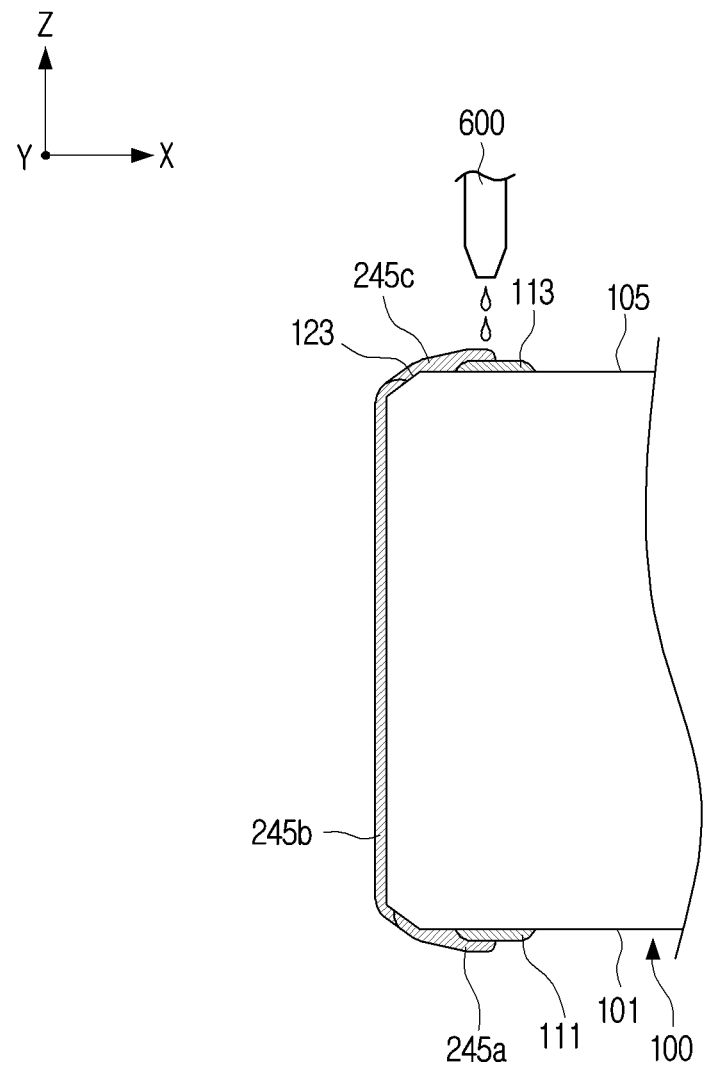

The nozzle 600 discharges the conductive ink while moving in a direction opposite to the side surface 103 of the glass substrate 100 from a position where an end portion of the second portion 245b may be covered or contacted and discharges the conductive ink so as to cover a portion of the second connection pad 113 as illustrated in FIG. 20F. Accordingly, the conductive ink discharged from the nozzle 600 may form a third portion 245c forming a portion of the side wiring.

Figure 20G:
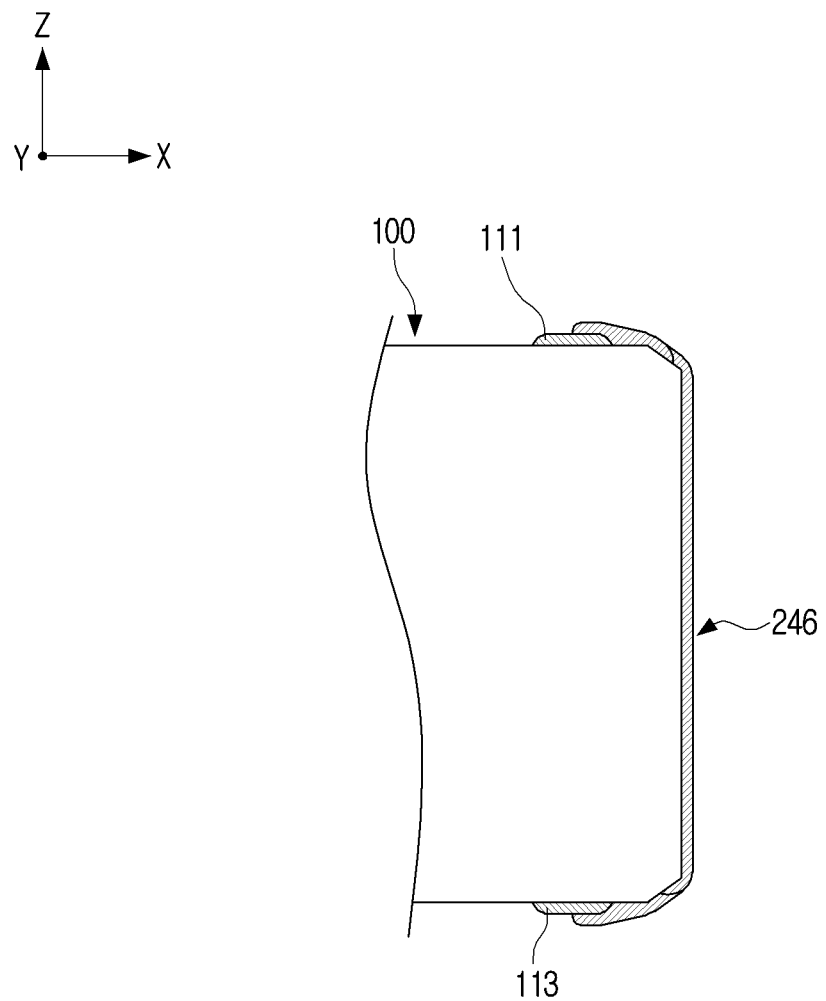

As described above, the first to third portions 245a, 245b, and 245c discharged to the edge area of the glass substrate 100 by the nozzle 600 may be cured by heating to a predetermined temperature for a predetermined time or cured at room temperature to form one side wiring 246 as illustrated in FIG. 20G (S53).

For convenience of description, the 3D inkjet printing apparatus is described as having one nozzle 600, but is not limited thereto, and may include a plurality of nozzles to form a plurality of side wirings by simultaneously discharging the conductive ink from each nozzle.

In addition, in the fifth embodiment of the disclosure, it is described that the glass substrate 100 is rotated by 90 degrees counterclockwise and the conductive ink is then discharged while moving the nozzle 600, but the disclosure is not limited thereto, and the glass substrate 100 is not rotated, and the nozzle may be rotated 90 degrees clockwise and then moved by a predetermined distance, thereby discharging the conductive ink to the edge area of the glass substrate 100 to form the side wiring.

The above-described embodiments according to the disclosure have described a structure in which the side wirings are formed in one edge area among four edge areas of the glass substrate, but the disclosure is not limited thereto and it is also possible that the side wirings are arranged in two edge areas among the four edge areas of the glass substrate.

FIGS. 21A to 21D and 22 are views illustrating diverse examples in which a plurality of side wirings are disposed on a pair of sides of the glass substrate, respectively.

Figure 21A:
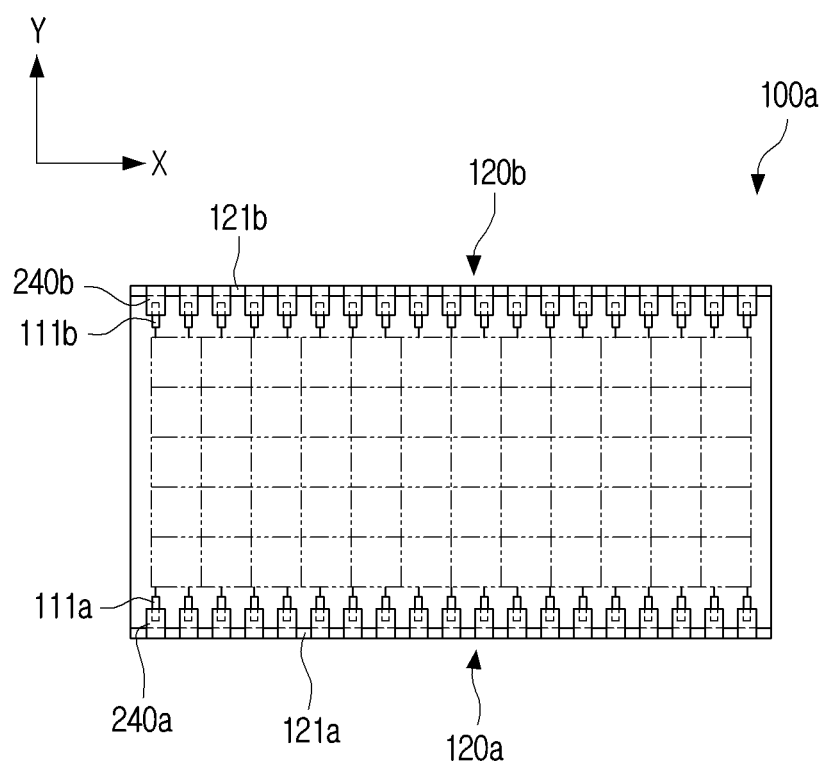
FIGS. 21A to 21D and 22 are views illustrating diverse examples in which a plurality of side wirings are disposed on a pair of sides of the glass substrate, respectively.

FIG. 21A is a plan view of a glass substrate 100a, and illustrates an example in which the glass substrate 100a is formed in a rectangle.

Referring to FIG. 21A, a plurality of side wirings 240a and 240b may be formed in a lower edge area 120a and an upper edge area 120b, respectively, corresponding to a pair of long sides facing each other (or disposed in parallel with each other) of the glass substrate 100a.

Chamfered surfaces 121a and 121b may be formed in the lower edge area 120a and the upper edge area 120b of the glass substrate 100a, respectively. The chamfered surfaces 121a and 121b illustrated in FIG. 21A are processed and formed at corners adjacent to a front surface of the glass substrate 100a, and although not illustrated in the drawing, chamfered surfaces corresponding to the chamfered surfaces 121a and 121b may be formed on a back surface of the glass substrate 100a, respectively.

In this case, a plurality of connection pads 111a disposed in the lower edge area 120a of the glass substrate 100a may be electrically connected to a plurality of gate lines of the TFT circuit, respectively, and a plurality of connection pads 111b disposed in the upper edge area 120b may be electrically connected to a plurality of data lines of the TFT circuit, respectively.

In contrast, the plurality of connection pads 111a disposed in the lower edge area 120a of the glass substrate 100a may be electrically connected to the plurality of data lines of the TFT circuit, respectively, and the plurality of connection pads 111b disposed in the upper edge area 120b may be electrically connected to the plurality of gate lines of the TFT circuit, respectively.

Figure 21B:
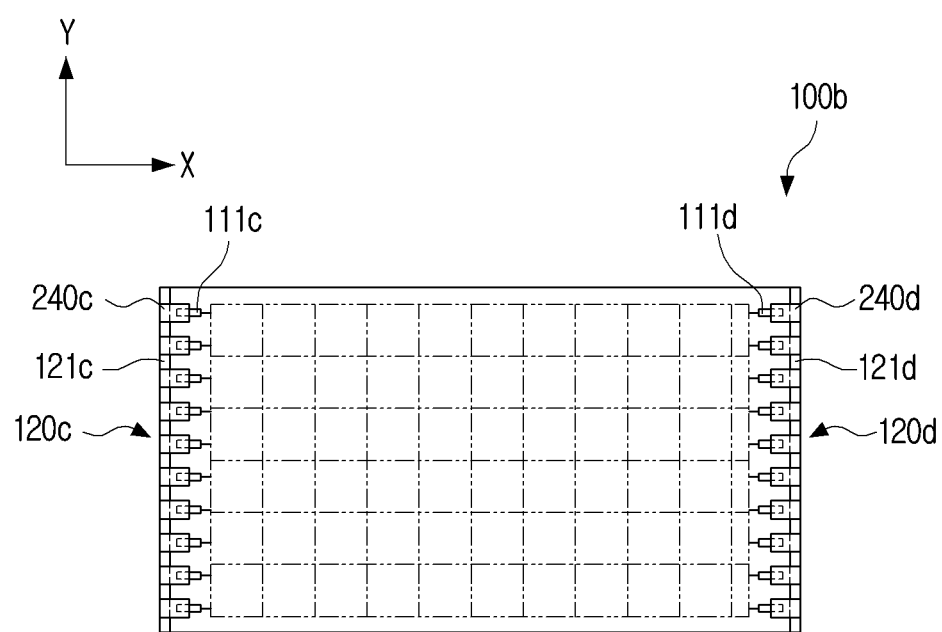

FIG. 21B is a plan view of a glass substrate 100b, and illustrates an example in which the glass substrate 100b is formed in a rectangle.

Referring to FIG. 21B, a plurality of side wirings 240c and 240d may be formed in a left edge area 120c and a right edge area 120d, respectively, corresponding to a pair of short sides facing each other (or disposed in parallel with each other) of the glass substrate 100b.

Chamfered surfaces 121c and 121d may be formed in the left edge area 120c and the right edge area 120d of the glass substrate 100b, respectively. The chamfered surfaces 121c and 121d illustrated in FIG. 21B are processed and formed at corners adjacent to a front surface of the glass substrate 100b, and although not illustrated in the drawing, chamfered surfaces corresponding to the chamfered surfaces 121c and 121d may be formed on a back surface of the glass substrate 100b, respectively.

In this case, a plurality of connection pads 111c disposed in the left edge area 120c of the glass substrate 100b may be electrically connected to a plurality of gate lines of the TFT circuit, respectively, and a plurality of connection pads 111d disposed in the right edge area 120d may be electrically connected to a plurality of data lines of the TFT circuit, respectively.

In contrast, the plurality of connection pads 111c disposed in the left edge area 120c of the glass substrate 100b may be electrically connected to the plurality of data lines of the TFT circuit, respectively, and the plurality of connection pads 111d disposed in the right edge area 120d may be electrically connected to the plurality of gate lines of the TFT circuit, respectively.

Figure 21C:
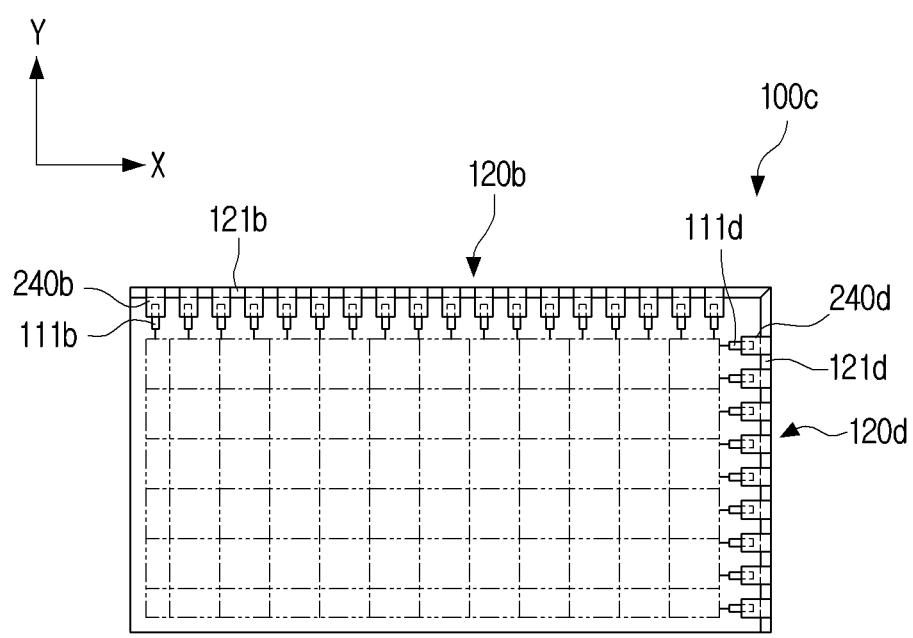

FIG. 21C is a plan view of a glass substrate 100c, and illustrates an example in which the glass substrate 100c is formed in a rectangle.

Referring to FIG. 21C, a plurality of side wirings 240b and 240d may be formed in the upper edge area 120b and the right edge area 120d, respectively, corresponding to the long side and the short side of the glass substrate 100c adjacent to each other.

The chamfered surfaces 121c and 121d may be formed in the upper edge area 120b and the right edge area 120d of the glass substrate 100c, respectively. The chamfered surfaces 121c and 121d illustrated in FIG. 21C are processed and formed at corners adjacent to a front surface of the glass substrate 100c, and although not illustrated in the drawing, chamfered surfaces corresponding to the chamfered surfaces 121c and 121d may be formed on a back surface of the glass substrate 100c, respectively.

In this case, a plurality of connection pads 111b disposed in the upper edge area 120b of the glass substrate 100c may be electrically connected to a plurality of gate lines of the TFT circuit, respectively, and a plurality of connection pads 111d disposed in the right edge area 120d may be electrically connected to a plurality of data lines of the TFT circuit, respectively.

In contrast, the plurality of connection pads 111b disposed in the upper edge area 120b of the glass substrate 100c may be electrically connected to the plurality of data lines of the TFT circuit, respectively, and the plurality of connection pads 111d disposed in the right edge area 120d may be electrically connected to the plurality of gate lines of the TFT circuit, respectively.

Figure 21D:
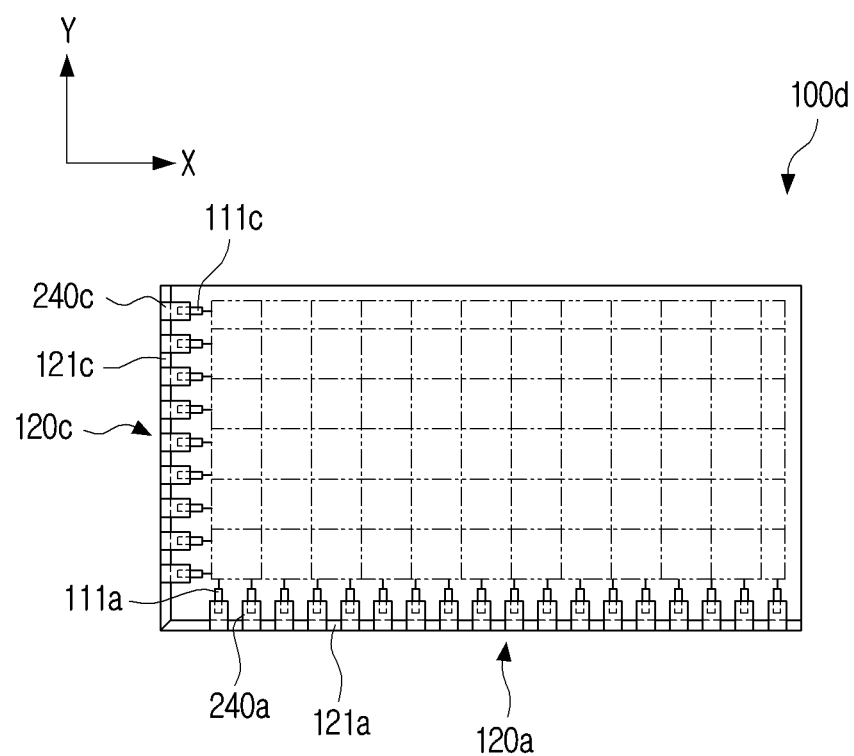

FIG. 21D is a plan view of a glass substrate 100d, and illustrates an example in which the glass substrate 100d is formed in a rectangle.

Referring to FIG. 21D, a plurality of side wirings 240a and 240c may be formed in the lower edge area 120a and the left edge area 120c, respectively, corresponding to the long side and the short side of the glass substrate 100d adjacent to each other.

Chamfered surfaces 121a and 121c may be formed in the lower edge area 120a and the left edge area 120c of the glass substrate 100d, respectively. The chamfered surfaces 121a and 121c illustrated in FIG. 21D are processed and formed at corners adjacent to a front surface of the glass substrate 100d, and although not illustrated in the drawing, chamfered surfaces corresponding to the chamfered surfaces 121a and 121c may be formed on a back surface of the glass substrate 100d, respectively.

In this case, a plurality of connection pads 111a disposed in the lower edge area 120a of the glass substrate 100d may be electrically connected to a plurality of gate lines of the TFT circuit, respectively, and a plurality of connection pads 111c disposed in the left edge area 120c may be electrically connected to a plurality of data lines of the TFT circuit, respectively.

In contrast, the plurality of connection pads 111a disposed in the lower edge area 120a of the glass substrate 100d may be electrically connected to the plurality of data lines of the TFT circuit, respectively, and the plurality of connection pads 111c disposed in the left edge area 120c may be electrically connected to the plurality of gate lines of the TFT circuit, respectively.

Figure 22:
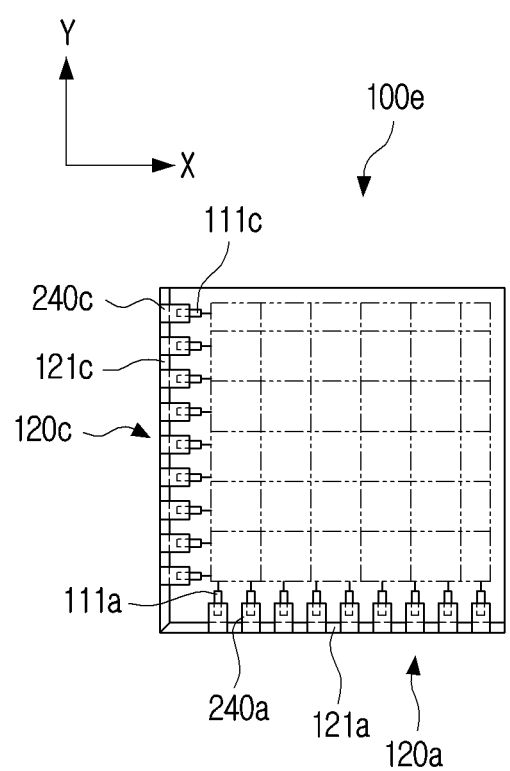

FIG. 22 is a plan view of a glass substrate 100e and illustrates an example in which the glass substrate 100e is in a square, and similarly to the glass substrate 100d illustrated in FIG. 21D, the chamfered surfaces 121a and 121c may be formed and the plurality of side wirings 240a and 240b may be disposed in the lower and left edge areas 120a and 120c corresponding to adjacent sides, respectively.

In addition, the glass substrate may be formed in the square as illustrated in FIG. 22, but is not limited thereto, and it is also possible that the four sides are formed in a proportion close to the square.

FIGS. 21A to 22 illustrate that the chamfered surfaces are processed and formed only in the edge areas of the glass substrate 100a in which the plurality of side wirings are formed, but the disclosure is not limited thereto and it is of course also possible to process and form the chamfered surfaces in all of the edge areas corresponding to the four sides of the glass substrate. In this case, the arrangement of the side wirings may be selectively set for each edge area.

Although the embodiments of the disclosure have been illustrated and described hereinabove, the disclosure is not limited to the abovementioned specific embodiments, but may be variously modified by those skilled in the art to which the disclosure pertains without departing from the gist of the disclosure as disclosed in the accompanying claims. These modifications should also be understood to fall within the scope and spirit of the disclosure.

What is claimed is:

1. A display module comprising:
    a substrate of a quadrangle type having a front surface and a back surface opposite to the front surface;
    a thin film transistor (TFT) layer formed on the front surface of the substrate;
    a plurality of light emitting diodes (LEDs) mounted on the TFT layer; and
    a plurality of side wirings formed at intervals in an edge area of the substrate,
    wherein the edge area comprises:
        a first area corresponding to a side surface of the substrate;
        a second area adjacent to the side surface of the substrate in the front surface of the substrate;
        a third area adjacent to the side surface of the substrate in the back surface of the substrate; and
    wherein each of the plurality of side wirings is disposed along the second area, the first area, and the third area,
    wherein the edge area comprises:
    a first chamfered surface formed at a corner at which the first area and the second area meet; and
    a second chamfered surface formed at a corner at which the first area and the third area meet; and
    wherein a height of the first chamfered surface is less than 10% of a thickness of the substrate.

2. The display module as claimed in claim 1,
    wherein a height of the second chamfered surface is less than 10% of a thickness of the substrate.

3. The display module as claimed in claim 1, wherein the plurality of side wirings are formed by screen printing with conductive ink.

4. The display module as claimed in claim 1, wherein one end portion of each of the plurality of side wirings is electrically connected to a first connection pad disposed in the second area,
- wherein another end portion of each of the plurality of side wirings is electrically connected to a second connection pad disposed in the third area, and
- wherein the first connection pad is connected to a pixel driving circuit of the TFT layer, and the first connection pad is connected to a driver Integrated Circuit disposed in a rear surface of a substrate.

5. The display module as claimed in claim 1, further comprising a plurality of connection pads formed in the edge area and electrically connected to the plurality of side wirings, and an insulating layer having grooves and disposed on the plurality of connection pads, the plurality of connection pads formed in the edge area being partially exposed by the grooves of the insulating layer.

6. A display module comprising:
- a substrate of a quadrangle type having a front surface and a back surface opposite to the front surface;
- a thin film transistor (TFT) layer formed on the front surface of the substrate;
- a plurality of light emitting diodes (LEDs) mounted on the TFT layer;
- a plurality of side wirings disposed along edge areas of at least two sides of the substrate, the plurality of side wirings being disposed at substantially equal intervals; and
- a plurality of connection pads disposed on the front surface of the substrate and electrically connected to the plurality of side wirings,
- wherein the plurality of connection pads comprise a plurality of first connection pads disposed on the front surface in a first edge area of the edge areas and a plurality of second connection pads disposed on the front surface in a second edge area of the edge areas,
- wherein the plurality of side wirings comprise a plurality of first side wirings disposed along the first edge area and a plurality of second side wirings disposed along the second edge area, and
- wherein the substrate includes a first chamfered surface formed at a corner of the first edge of the edge areas and a second chamfered surface at a corner of the second edge of the edge areas, the plurality of first side wirings being disposed along the first chamfered surface, and the plurality of second side wirings being disposed along the second chamfered surface.

7. The display module as claimed in claim 6, wherein the first and second edge areas correspond to a pair of opposing sides in the substrate, respectively.

8. The display module as claimed in claim 6, wherein the first and second edge areas correspond to a pair of adjacent sides in the substrate, respectively.

9. The display module as claimed in claim 6, wherein the number of the plurality of side wirings is equal to or less than the number of LEDs mounted on the TFT layer.

10. The display module as claimed in claim 6, further comprising an insulating layer having grooves and disposed on the plurality of connection pads,
- wherein the plurality of first connection pads disposed in the first edge area are partially exposed by the grooves of the insulating layer.

* * * * *